(12) United States Patent
Usami

(10) Patent No.: US 10,734,336 B2
(45) Date of Patent: Aug. 4, 2020

(54) SEMICONDUCTOR DEVICE AND METHOD FOR MANUFACTURING THE SAME

(71) Applicant: RENESAS ELECTRONICS CORPORATION, Tokyo (JP)

(72) Inventor: Tatsuya Usami, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 6 days.

(21) Appl. No.: 16/183,359

(22) Filed: Nov. 7, 2018

(65) Prior Publication Data

US 2019/0198468 A1 Jun. 27, 2019

(30) Foreign Application Priority Data

Dec. 26, 2017 (JP) .................................. 2017-249495

(51) Int. Cl.
*H01L 21/768* (2006.01)
*H01L 23/00* (2006.01)
(Continued)

(52) U.S. Cl.
CPC ............ *H01L 24/02* (2013.01); *H01L 21/768* (2013.01); *H01L 23/498* (2013.01); *H01L 23/5329* (2013.01); *H01L 23/53223* (2013.01); *H01L 23/53238* (2013.01); *H01L 23/53295* (2013.01); *H01L 24/25* (2013.01); *H01L 24/03* (2013.01); *H01L 24/05* (2013.01); *H01L 2224/023* (2013.01); *H01L 2224/024* (2013.01); *H01L 2224/0231* (2013.01);
(Continued)

(58) Field of Classification Search
CPC .......... H01L 2224/04042; H01L 24/02; H01L 23/5226; H01L 24/25; H01L 2224/22; H01L 2224/25; H01L 2224/023
See application file for complete search history.

(56) References Cited

U.S. PATENT DOCUMENTS 6,222,269 B1* 4/2001 Usami ............... H01L 21/76801
257/758
7,812,456 B2* 10/2010 Koide ................. H01L 23/3114
257/776
(Continued)

FOREIGN PATENT DOCUMENTS

JP 2001-085526 A 3/2001
JP 2009-194144 A 8/2009

*Primary Examiner* — Mohammed Shamsuzzaman
*Assistant Examiner* — Khatib A Rahman
(74) *Attorney, Agent, or Firm* — McDermott Will & Emery LLP

(57) ABSTRACT

Reliability of a semiconductor device is improved. A first pad electrode is formed in an uppermost layer of a multilayer wiring layer, an insulating film of a non-organic material is formed over the first pad electrode, and an organic insulating film is formed over the insulating film. In the organic insulating film, an opening reaching the first pad electrode and a groove reaching the insulating film are formed. Over the organic insulating film, a plurality of re-wirings each having a barrier metal film and a conductive film are formed. In a plan view, the groove is formed in an area between the re-wirings. At the same time, a width of the groove is smaller than a width of a first portion or a width of a second portion of the re-wirings, respectively, neighboring to each other and extending in a first direction.

11 Claims, 19 Drawing Sheets

(51) Int. Cl.
*H01L 23/532* (2006.01)
*H01L 23/498* (2006.01)

(52) U.S. Cl.
CPC ........... *H01L 2224/0236* (2013.01); *H01L 2224/0239* (2013.01); *H01L 2224/02373* (2013.01); *H01L 2224/02375* (2013.01); *H01L 2224/02381* (2013.01); *H01L 2224/0345* (2013.01); *H01L 2224/0346* (2013.01); *H01L 2224/0347* (2013.01); *H01L 2224/0391* (2013.01); *H01L 2224/04042* (2013.01); *H01L 2224/22* (2013.01); *H01L 2224/25* (2013.01); *H01L 2924/059* (2013.01); *H01L 2924/05042* (2013.01); *H01L 2924/07025* (2013.01)

(56) References Cited

U.S. PATENT DOCUMENTS

| | | | |
|---|---|---|---|
| 10,504,861 B2 * | 12/2019 | Moriyama | H01L 23/3192 |
| 2013/0087828 A1 * | 4/2013 | Koshimizu | H01L 21/82385 |
| | | | 257/139 |
| 2013/0256906 A1 * | 10/2013 | Mori | H01L 21/768 |
| | | | 257/774 |
| 2016/0056107 A1 * | 2/2016 | Kuwajima | H01L 23/5223 |
| | | | 257/532 |
| 2016/0254143 A1 * | 9/2016 | Hanawa | H01L 21/02315 |
| | | | 438/763 |
| 2016/0370542 A1 * | 12/2016 | Usami | G02B 6/13 |
| 2018/0372950 A1 * | 12/2018 | Usami | G02B 6/12 |

* cited by examiner

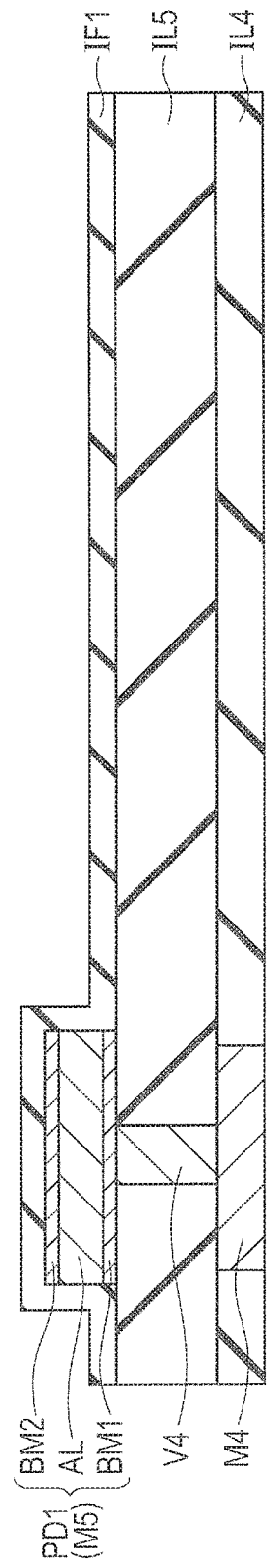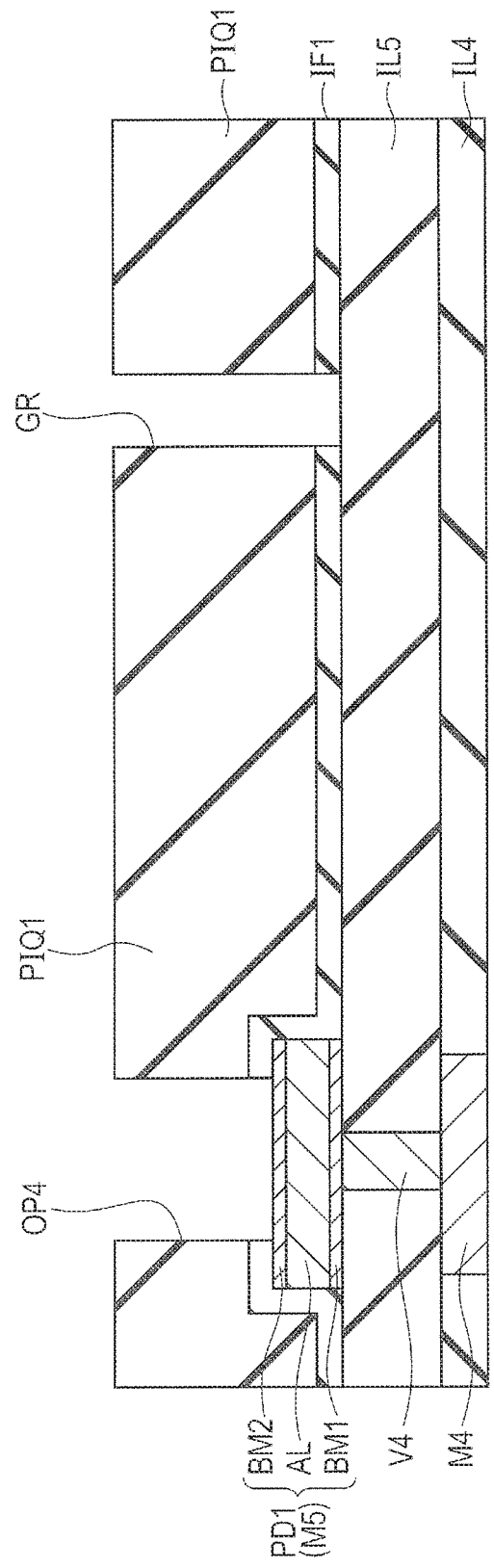

SEMICONDUCTOR DEVICE AND METHOD FOR MANUFACTURING THE SAME

CROSS-REFERENCE TO RELATED APPLICATIONS

The disclosure of Japanese Patent Application No. 2017-249495 filed on Dec. 26, 2017 including the specification, drawings and abstract is incorporated herein by reference in its entirety.

BACKGROUND

The present invention relates to a semiconductor device and a method for manufacturing the same and, for example, is applicable to a semiconductor device having re-wirings and a method for manufacturing the same.

In recent years, due to the demand for higher speed operation and miniaturization of semiconductor device, a wiring called a "re-wiring," which is formed over a first pad electrode being part of an uppermost-layer wiring of a multilayer wiring layer over a semiconductor substrate, has been in use. The re-wiring is configured mainly using a thick copper film formed, for example, by the plating method, in order to make wiring resistance thereof low. Some part of an upper surface of the re-wiring is used as an area for coupling with an external-connection terminal including a bump electrode or a wire bonding, for example, and serves as a second pad electrode. Further, the second pad electrode is electrically coupled to a printed circuit board etc. through the external-connection terminal.

Patent Document 1 (Japanese Unexamined Patent Publication Application No. 2009-194144) discloses a technique for forming a re-wiring and a dummy plating layer in the same layer as the re-wiring over a multilayer wiring layer.

Patent Document 2 (Japanese Unexamined Patent Application Publication No. 2001-85526) discloses a fuse formed in a multilayer wiring layer and a re-wiring formed over the multilayer wiring layer. Further, it discloses a technique for providing an opening in a protective film in an upper portion of the fuse after formation of the re-wiring.

SUMMARY

A re-wiring mainly includes: a conductive film formed over an organic insulating film and containing copper as its principal component; and a barrier metal film formed between the conductive film and the organic insulating film. However, when conductive foreign matters exist over the organic insulation film, they cause a problem of deterioration of life of an HAST test (Highly Accelerated Temperature and Humidity Stress Test) between two neighboring re-wirings. That is, since insulation resistance between the two neighboring re-wirings deteriorates, a leakage current occurs between the re-wirings as time passes.

Other objects and novel features of the present invention will become apparent from the description of the present specification and the accompanying drawings.

The following describes briefly the outline of a typical embodiment among embodiments disclosed in the present application.

A semiconductor device being one embodiment includes: a multilayer wiring layer formed over a semiconductor substrate; a first pad electrode formed in an uppermost layer of the multilayer wiring layer; an insulating film formed over the first pad electrode and also formed from a non-organic material; a first organic insulating film formed over the insulating film; a first opening formed in the first organic insulating film and reaching the first pad electrode; and a groove formed in the first organic insulating film and reaching the insulating film. Moreover, the semiconductor device includes a plurality of re-wirings formed over the first organic insulating film, each having a barrier metal film, and having a plurality of re-wirings including a first re-wiring and a second re-wiring. In this regard, in a plan view, the groove is formed in an area between the first re-wiring and the second re-wiring and is formed along a direction in which the first re-wiring or the second re-wiring extends. At the same time, a width of the groove is smaller than a width of a first portion or a width of a second portion of the neighboring first re-wiring and the second re-wiring, respectively, extending in a first direction.

According to one embodiment, the reliability of the semiconductor device can be improved.

BRIEF DESCRIPTION OF THE DRAWINGS

FIG. 11 shows a sectional view during a manufacturing process of the semiconductor device of Embodiment 2;

FIG. 12 shows a sectional view during a manufacturing process of the semiconductor device following that shown in FIG. 11;

DETAILED DESCRIPTION

Figure 1:
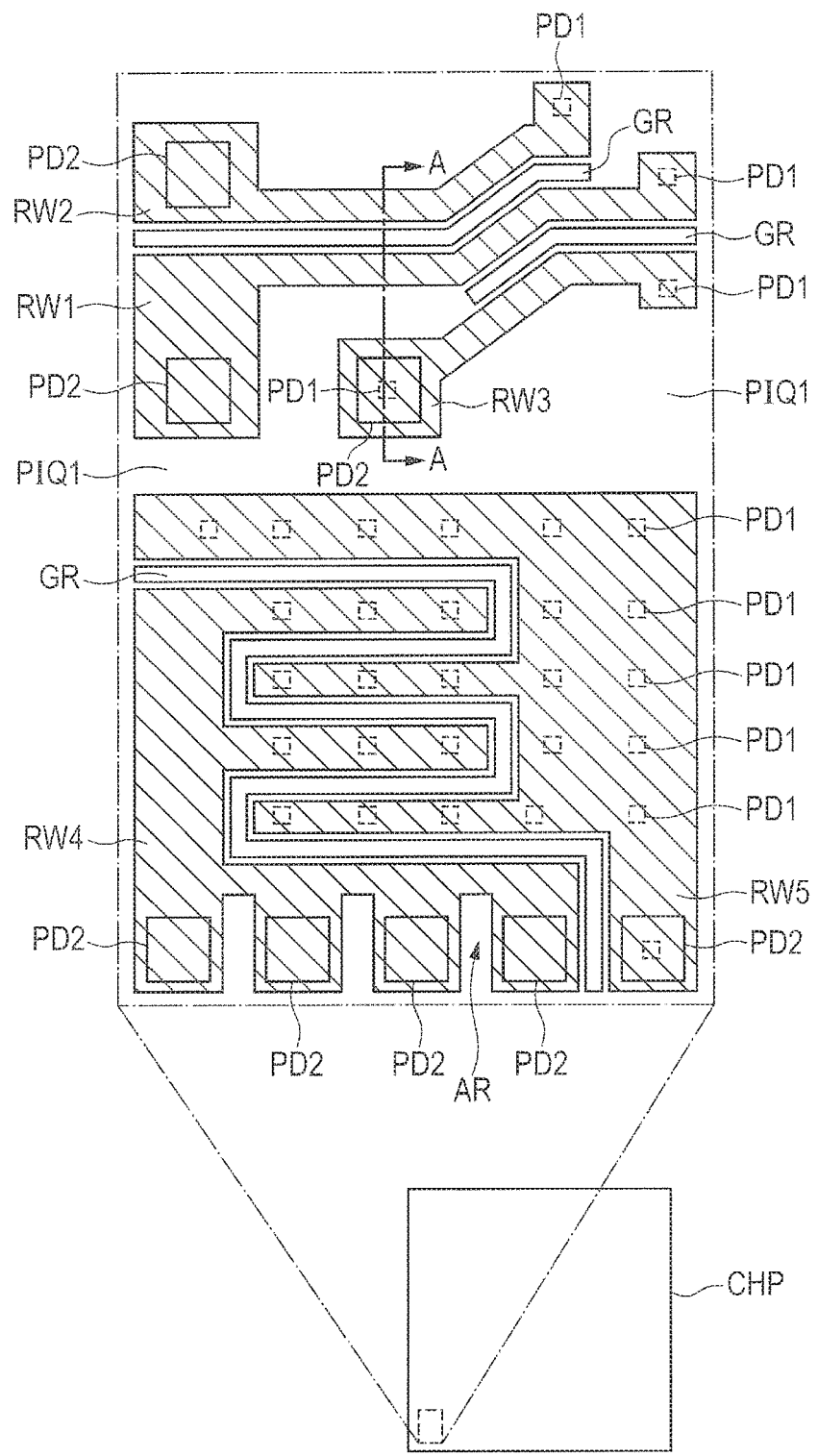
FIG. 1 is a plan view of a semiconductor device of Embodiment 1.

The following embodiments will be described, divided into plural sections or embodiments, if necessary for convenience. Except for the case where its shows clearly in particular, they are not mutually unrelated and one has relationships such as a modification, details, and supplementary description of some or entire of another. In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically. Furthermore, in the following embodiments, it is needless to say that an element (including an element step etc.) is not necessarily indispensable except for the case where it is clearly specified in particular and where it is considered to be clearly indispensable from a theoretical point of view, etc. Similarly, in the following embodiments, when shape, positional relationship, etc. of an element etc. is referred to, what resembles or is similar to the shape substantially shall be included except for the case where it is clearly specified in particular and where it is considered to be clearly not right from a theoretical point of view. This statement also applies to the numeric value and range described above.

In all the drawings for explaining the embodiments, members having the same functions are given the same reference symbols, and their repeated descriptions may b omitted. Further, in the following embodiments, as a principle, unless it is particularly required, explanations of the same or similar elements will not be repeated.

Moreover, in the drawings used in the embodiment, in order to make a drawing intelligible, hatching may be omitted.

Embodiment 1

Semiconductor devices of the present embodiment and other embodiments are the ones provided with re-wirings. Hereafter, there will be explained, in due order, a configuration of the semiconductor device of the present embodiment, a method for manufacturing the semiconductor device of the present embodiment, a semiconductor device of a comparative example, and main features of the present embodiment.

<Configuration of Semiconductor Device>

Figure 2:
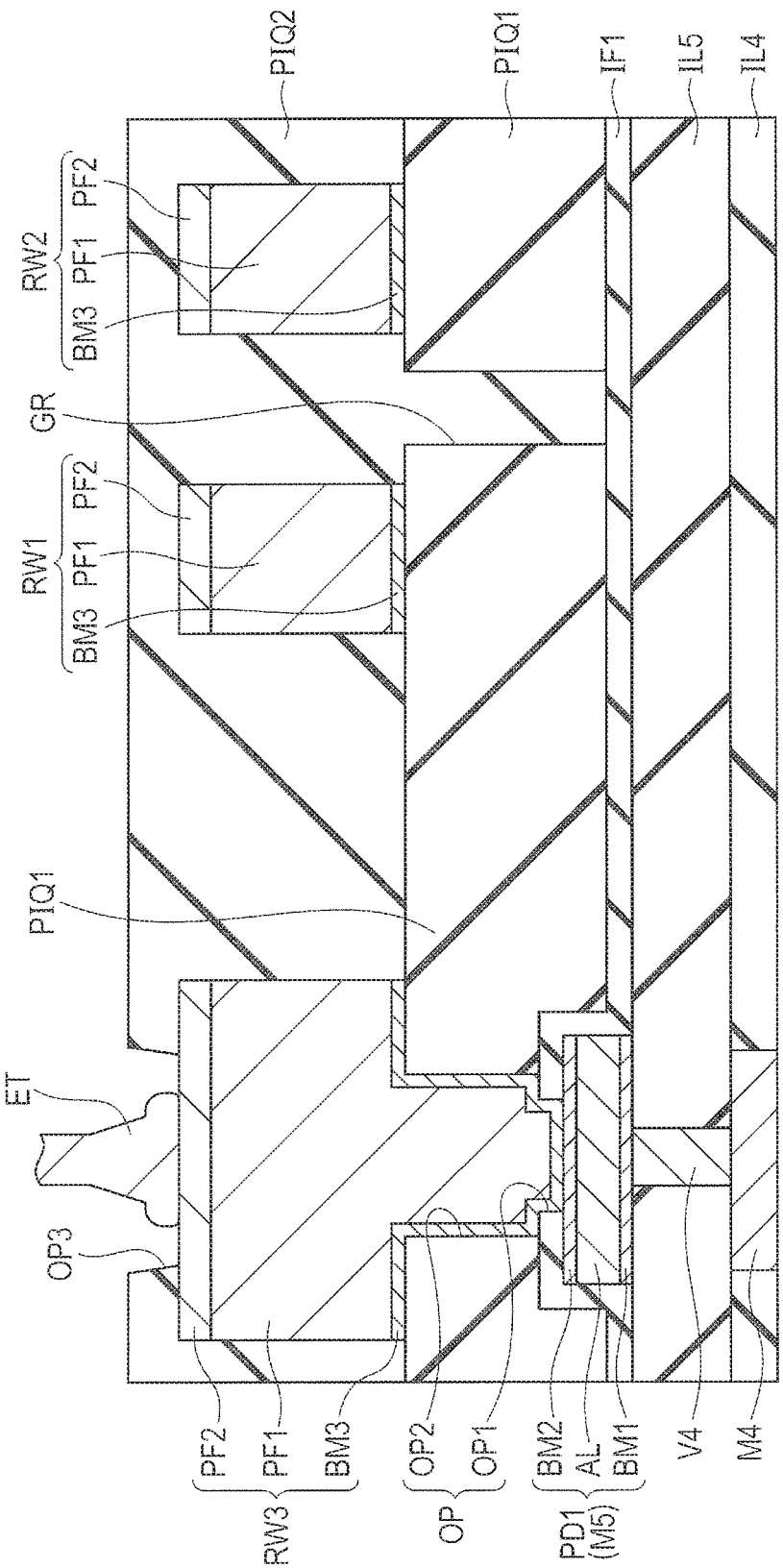
FIG. 2 is a sectional view of the semiconductor device of Embodiment 1.

With reference to FIGS. 1 and 2, the configuration of the semiconductor device of the present embodiment will be explained. FIG. 1 is a plan view showing an outline of a layout of a semiconductor chip CHP being the semiconductor device of the present embodiment. FIG. 2 is a sectional view of a principal part taken along line A-A of FIG. 1. Although FIG. 1 is the plan view, in order to make a drawing intelligible, hatching is attached to each of the re-wirings RW1 to RW5.

As shown in FIG. 1, in a plan view, the semiconductor chip CHP has a rectangular shape. Moreover, in FIG. 1, part of the semiconductor chips CHP is shown in an enlarged manner, and an enlarged area is shown by a dash-and-dot line. Over a surface of the semiconductor chip CHP, a plurality of re-wirings RW1 to RW5 are formed. The re-wirings RW1 to RW5 are coupled to a first pad electrode PD1 formed in an uppermost layer of a multilayer wiring layer. Part of each the re-wirings RW1 to RW5 forms a second pad electrode PD2. The second pad electrode PD2 serves as an area for coupling with terminals ET for external connection, such as wire bonding or a bump electrode. Also, in FIG. 1, in order to make contours of the re-wirings RW1 to RW5 intelligible, there are omitted the terminals ET for external connection formed over the re-wirings RW 1 to 5 and an organic insulating film PIQ2. Moreover, the first pad electrode PD1 is shown by a broken line, since it is actually covered with the re-wirings RW1 to RW5.

When seen in a plan view, a groove GR is formed in an organic insulating film PIQ1 in an area between neighboring re-wirings which are particularly close among the re-wirings RW1 to RW5. Two re-wirings arranged at the opposite positions, sandwiching the groove GR is couple to electric potential different from each other. If the re-wirings are coupled to the same electric potential, the leak between the neighboring re-wirings will not pose a problem. In the present embodiment, at least, the re-wirings RW1 and RW2, the re-wirings RW1 and RW3, and the re-wirings RW4 and RW5 are the re-wirings coupled to the different electric potentials different from each other. Incidentally, in the present specification, "neighboring" means adjoining each other, and two neighboring re-wirings are not in contact with each other.

Shapes and lengths of the re-wirings RW1 to RW5 are not particularly limited, if the first electrode pad PD1 and the second electrode pad PD2 can be electrically coupled and the second electrode pad PD2 can be arranged at a predetermined position. For example, each of the re-wirings RW1 to RW5 has a line-like portion which extends along a predetermined direction.

As a whole, with respect to the re-wirings RW1 to RW5, only a shape, a size, a position, and the number of first pad electrodes PD1 and second electrode pads PD2 coupled thereto are different. As for the aspect that, when seen in a plan view, in an area between the closest neighboring re-wirings among the re-wirings RW1 to RW5, the groove GR is formed in the organic insulating film PIQ1 is formed is common. Therefore, hereinafter, a case of the re-wiring RW1 and the re-wiring RW2 will be explained as typical examples of the re-wirings which are particularly close to each other.

Of the re-wirings formed in the semiconductor chip CHP, the re-wiring RW1 and the re-wiring RW2 are the most minutely processed re-wirings. For this reason, a distance between the re-wiring RW1 and the re-wiring RW2 is about the same as a width of the re-wiring RW1 or a width of re-wiring RW2. Therefore, a width of the groove GR formed between the re-wiring RW1 and the re-wiring RW2 is smaller than the width of re-wiring RW1 or the width of the re-wiring RW2. In addition, the width of the re-wiring RW1 and the width of the re-wiring RW2 may be greater than the distance between the re-wiring RW1 and the re-wiring RW2.

Each "width" described in the present embodiment is a length of a side (face) of each of the re-wirings opposed to each other sandwiching the groove GR in a plan view. Therefore, the opposing direction varies according to the position in the semiconductor chip CHP. Moreover, when indicated as a "distance" between the two neighboring re-wirings such as a distance between the re-wiring RW1 and the re-wiring RW2, if it is illustrated using the re-wiring RW1 and the re-wiring RW2, the "distance" means a shortest distance between a side of the re-wiring RW1 and aside of the re-wiring RW2 opposed to the side of the re-wiring RW1.

The width of each of the re-wirings RW1 to RW5 is not limited in particular. According to the present embodiment, the width of the re-wirings RW1 to RW3 is, for example, between 10 µm and 12 µm.

The groove GR is formed along a direction in which the re-wirings RW1 and the re-wiring RW2 extend. That is, in a plan view, the groove GR is formed along the opposed sides (faces) of the neighboring re-wirings. As shown in FIG. 1, the groove GR is provided in an area where the distance between the neighboring re-wirings RW1 and RW2 is short. Therefore, the direction in which the groove GR extends is not limited to X-direction and Y-direction orthogonal to X-direction in a plan view. For example, it also includes a direction inclined at an angle smaller than a right angle with respect to X-direction. That is, the direction in which the groove GR extends may be X-direction or the direction inclined to X-direction.

Although explained in detail later, according to the present embodiment, by providing the groove GR described above, it becomes possible to solve the problem of life of the HAST test being deteriorated and the leakage current occurring between the neighboring re-wirings RW1 and RW2 as time passes.

Moreover, the groove GR may preferably be formed when the distance between the neighboring re-wirings RW1 and RW2 is 12 µm or less. When the above distance is greater than 12 µm, the groove GR may be formed or may not be formed. According to the present embodiment, the distance between the re-wiring RW1 and the re-wiring RW2 is 12 µm on the line A-A of FIG. 1, and the distance between the re-wiring RW3 and the re-wiring RW1 is 15 µm. Also, the width of the groove GR itself is about 6 to 8 µm. The depth of the groove GR is not limited in particular, but is determined according to the film thickness of the organic insulating film PIQ1.

Moreover, the groove GR may not be formed even when the distance between the neighboring re-wirings RW4 is short, as shown in an area AR of FIG. 1. For example, since the problem of the above leakage current does not occur when the neighboring two portions in the re-wiring RW4 are re-wirings coupled to the same electric potential, it is not necessary to form the groove GR. According to the present embodiment, two portions of the re-wiring RW4 formed in an area AR are coupled to the same electric potential and are integrated at a spot other than the area AR.

Hereafter, with reference to FIG. 2, a cross-sectional structure of the semiconductor chip CHP will be explained. The semiconductor chip CHP includes: multilayer interlayer insulating films (insulating films) IL0 to IL5; and multilayer wiring layers M1 to M5. Also, the main features of the present embodiment are in the structure above the multilayer wiring layers M1 to M5. Therefore, the fourth wiring M4 and its upper layer structure is shown here, and a structure of a layer lower than the fourth wiring M4 will not be explained. The structure of the lower layer and its manufacturing method will be explained with reference to FIG. 3 later.

The fourth wiring M4 of a so-called damascene structure is formed in the interlayer insulating film IL4 in an upper part of the semiconductor chip CHP. That is, the fourth wiring M4 is formed by embedding a conductive film including copper as its principal component into a groove formed in the interlayer insulating film IL4.

The interlayer insulating film IL5 is formed over the fourth wiring M4, and a via V4 is formed in the interlayer insulating film IL5. Further, the interlayer insulating film IL5 is an insulating film formed from a non-organic material.

In addition, the interlayer insulating film IL5 includes, for example, silicon oxide or fluorine-added silicon oxide, and the via V4 includes, for example, tungsten as its principal component.

A fifth wiring M5 is formed over the interlayer insulating film IL5. The fifth wiring M5 is coupled with the fourth wiring M4 through the via V4. A plurality of fifth wirings M5 is formed in the uppermost layer of the multilayer wiring layer, and part of them serves as the first pad electrode PD1. The first pad electrode PD1 includes a barrier metal film BM2 formed over the barrier metal film BM1, a conductive film AL formed over the barrier metal film BM1, and a barrier metal film BM2 formed over the conductive film AL. In this regard, the barrier metal film BM1 and the barrier metal film BM2 include titanium nitride or a laminated film of titanium nitride and titanium, respectively. Moreover, the conductive film AL includes aluminum as its principal component.

An insulating film IF1 is formed over the first pad electrode PD1 and over the interlayer insulating film IL5. For the purpose of mainly preventing moisture from entering, the insulating film includes a material which is highly resistant to moisture. The insulating film IF1 is an insulating film formed from a non-organic material and, for example, includes silicon nitride or oxy-silicon nitride. In the insulating film IF1, there is formed an opening OP1 reaching the first pad electrode PD1 and exposing part of the first pad electrode PD1.

Over the insulating film IF1, there is formed an organic insulating film PIQ1 including polyimide, for example. As long as pressure resistance between the re-wirings RW1 to RW3 and the wiring layer of the uppermost layer is sufficient, a film thickness of the organic insulating film PIQ1 is not particularly limited and is, for example, 4 to 8 µm. In the organic insulating film PIQ1, so as to expose the first pad electrode PD1, there is formed an opening OP having the opening OP1 and an opening OP2 which is in communication with the opening OP1.

A groove GR is also formed in the organic insulating film PIQ1. The groove GR is formed penetrating the organic insulating film PIQ1 such that part of the insulating film IF1 is exposed in the bottom of the groove GR. That is, in a cross-section which passes along the organic insulating film PIQ1, the re-wiring RW1, and the re-wiring RW2, the groove GR is so provided as to separate the organic insulating film PIQ1 formed under the re-wiring RW1 from the organic insulating film PIQ1 formed under the re-wiring RW2.

The re-wirings RW1 to RW3 are formed over the organic insulating film PIQ1. The re-wiring RW3 shown in FIG. 2 is coupled to the first pad electrode PD1 by being formed to be embedded in the opening OP. In addition, as in the case of the re-wiring RW3, the re-wirings RW1, RW2, RW4, and RW5 shown in FIG. 1 are also coupled to the first pad electrode PD1 through the opening OP, respectively.

The re-wirings RW1 to RW3 mainly include a conductive film PF1 and a barrier metal film BM3. In the present embodiment, there are shown the re-wirings RW1 to RW3 including the barrier metal film BM3, the conductive film PF1 formed over the barrier metal film BM3, and a conductive film PF2 formed over the conductive film PF1.

The conductive film PF1 includes copper as its principal component, for example. The conductive film PF2 includes a material different from that of the conductive film PF1 and, for example, it includes nickel. Moreover, the conductive film PF2 may be a laminated film of a nickel film and a gold film. The conductive film PF2 is a film so provided as to enhance close contact with the terminal ET for external connection, and may not be formed when a desired close contact is obtained. That is, a level of close contact between the conductive film PF2 and the terminal ET for external connection is higher than a level of close contact between the conductive film PF1 and the terminal ET for external connection. Moreover, to lower overall resistance of the re-wiring RW, the conductive film PF1 includes a material whose sheet resistance is lower than that of the conductive film PF2 and has a film thickness thicker than that of the conductive film PF2. Moreover, for the same reason, the conductive film PF1 includes a material whose sheet resistance is lower than that of the barrier metal film BM3 and has a film thickness thicker than that of the barrier metal film BM3.

The barrier metal film BM3 is a conductive film which contains titanium, tantalum, or chromium, for example, and has a function to prevent diffusion of the conductive film PF1 (copper). Moreover, the barrier metal film BM3 may be a single-layer film of the above material. However, it may be a laminated film made by forming, for example, a nitride metal film, such as titanium nitride or tantalum nitride, over the single-layer film.

Over the rewiring RW1 to RW5 and over the organic insulation film PIQ1, the organic insulating film PIQ2 is formed. Moreover, the organic insulating film PIQ2 is embedded in the groove GR. The organic insulating film PIQ2 is formed from the same material as that of the organic insulating film PIQ1, and includes, for example, an insulating film of polyimide. An opening OP3 is formed in the organic insulating film PIQ2. In the re-wiring RW3, an area exposed from the opening OP3 serves as a second pad electrode PD2. The second pad electrode PD2 is the area for coupling with the external-connection terminal ET.

Over the second pad electrode PD2, the terminal ET for external connection including a wire bonding or a bump electrode is formed. As a material for the wire bonding, copper or gold can be used, for example. Also, as a material for the bump electrode, solder or gold can be used, for example. In addition, in the present embodiment, a case where the wire bonding is used as the terminal ET for external connection is shown.

Moreover, the organic insulating film PIQ2 may not necessarily be formed. In such a case, part of an area of the re-wiring RW3 to which the terminal ET for external connection is coupled can be regarded as the second pad electrode PD2.

However, it is more preferable to form the organic insulating film PIQ2 to secure higher reliability. In particular, in the present embodiment, the insulating film IF1 is exposed at the bottom of the groove GR. There is a possibility that moisture etc. may enter, through the groove GR, from the outside of the semiconductor device. However, as compared to a case where the insulating film IF1 alone is formed at the bottom of the groove GR, a case where the inside of the groove GR is filled with the organic insulating film PIQ2 can prevent entrance of the above moisture more reliably.

<Method for Manufacturing Semiconductor Device>

Figure 3:
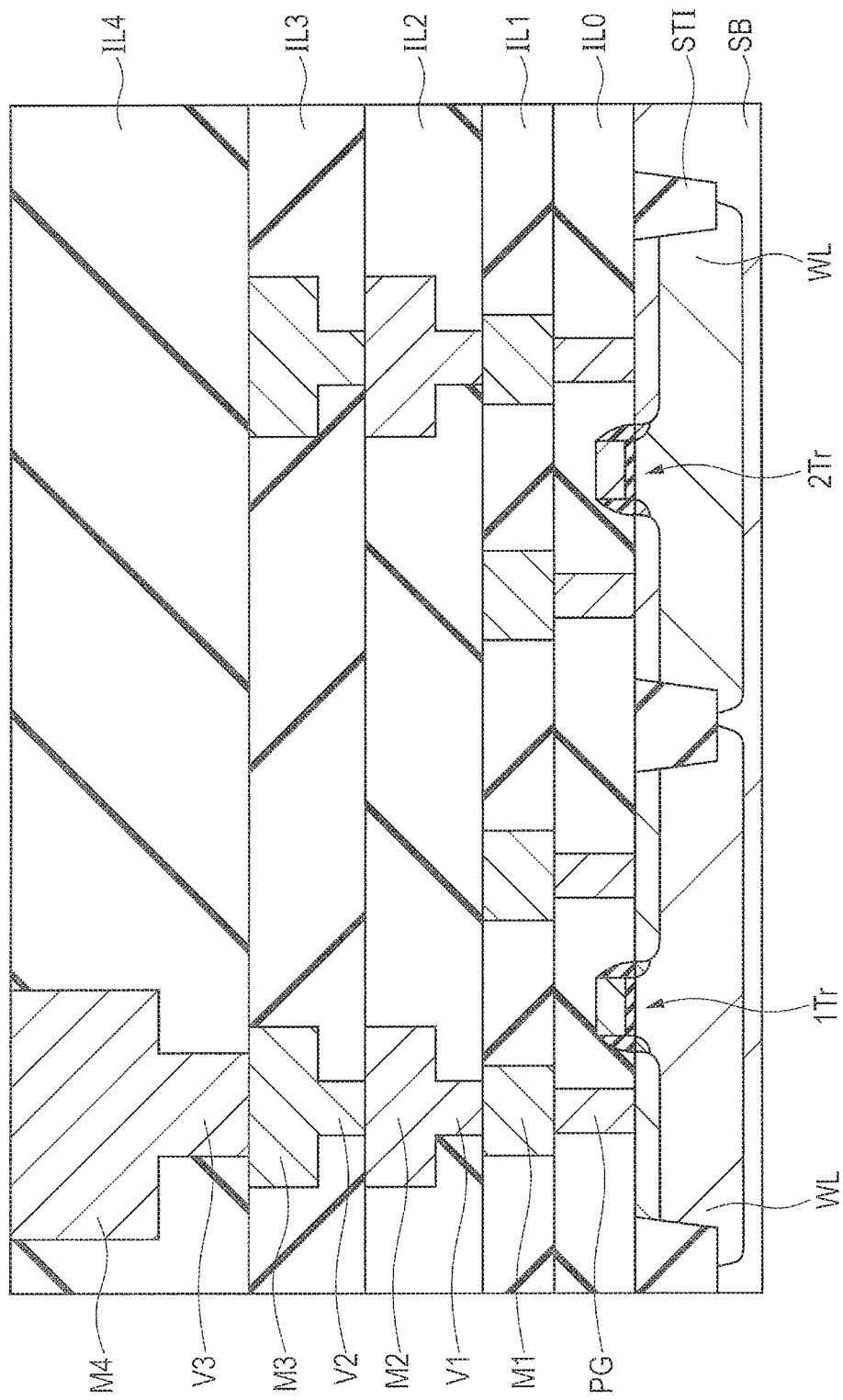
FIG. 3 is a sectional view of the semiconductor device of Embodiment 1.

With reference to FIGS. 3 to 9, a method for manufacturing a semiconductor device according to the present embodiment will be explained. FIG. 3 is a sectional view showing the fourth wiring M4 and its lower layer structure, and FIGS. 4 to 9 are sectional views showing the fourth wiring M4 and its upper structure. In addition, as in FIG. 2, these sectional views correspond to the sectional view taken along line A-A of FIG. 1.

Also, in the present embodiment, implementation of a multilayer wiring layer by a five-layer wiring layer has been explained. However, there may be more than five or less than five wiring layers laminated. Moreover, since the main features of the present embodiment are the structure above the multilayer wiring layer and its manufacturing method, part of the explanation about the specific manufacturing method of semiconductor elements formed near a main surface of the semiconductor substrate is omitted.

First, as shown in FIG. 3, there is provided a semiconductor substrate (semiconductor wafer) SB which includes a p-type single crystal silicon having, for example, resistivity of 1 to 10 $\Omega$cm etc. Next, a plurality of element separation parts STI which specify an active area in the semiconductor substrate SB is formed. The element separation part STI is formed by embedding an insulating film which mainly includes silicon oxide, for example, in a groove formed in the semiconductor substrate SB.

Next, after having introduced impurities into the semiconductor substrate SB and forming a well WL, there are formed a MISFET1Tr and a MISFET2Tr including a gate electrode formed over the well WL through the gate insulating film and a source/drain area formed in the well WL, respectively.

Next, an interlayer insulating film IL0 covering the MISFET1Tr and the MISFET2Tr is formed over the semiconductor substrate SB. The interlayer insulating film IL0 is formed from a silicon oxide film, for example, and can be formed, for example, using the CVD method etc. Next, a contact hole is formed in the interlayer insulating film IL0 using the photolithography technique and the dry etching technique. Then, a plug PG is formed in the contact hole by embedding a metal film which includes tungsten, for example. The Plug PG is coupled to the MISFET1Tr or the MISFET2Tr, etc.

Next, the interlayer insulating film IL1 is formed over the interlayer insulating film IL0 in which the plug PG is embedded. The Interlayer insulating film IL1 is formed from a material whose dielectric constant is lower than silicon oxide, for example, containing carbon such as SiOC. A first wiring M1 is formed using a so-called damascene method. That is, a groove is formed in the interlayer insulating film IL1 and, in this groove, a conductive film mainly containing copper is embedded, and the first wiring M1 is formed by removing an excessive conductive film outside the groove using the CMP (Chemical Mechanical Polishing) method. The first wiring M1 is coupled to the upper surface of the plug PG. In addition, a barrier metal film which prevents copper from diffusing may be formed between the copper and the interlayer insulating film ILL Next, over the interlayer insulating film IL1, the interlayer insulating film IL2 is so formed as to cover the first wiring M1. The interlayer insulating film IL2 is formed from the same material as that of the interlayer insulating film ILL Further, over a surface of the first firing M1, a barrier insulating film containing, for example, silicon carbon nitride and having a function to prevent copper from diffusing is formed (not shown here). Next, a via hole and a groove for wiring are formed in the interlayer insulating film IL2. A via V1 and the second wiring M2 are formed by embedding a conductive film including copper as its principal component in the groove and removing, for example, an excessive conductive film outside the groove using the CMP method. That is, the via V1 and the second wiring M2 are formed by one of the damascene methods, a dual damascene method, and are formed as an integral piece. This via V1 is coupled to an upper surface of the first wiring M1. In addition, a barrier metal film which prevents copper from diffusing may be formed between the copper and the interlayer insulating film IL2.

Next, the interlayer insulating film IL3 is formed over the interlayer insulating film IL2 and over the second wiring M2. Then, a via V2 and the third wiring M3 are formed in the interlayer insulating film IL3 using the same technique as used for forming the via V1 and the second wiring M2. Next, the interlayer insulating film IL4 is formed over the interlayer insulating film IL3 and over the third wiring M3. Then, a via V3 and the fourth wiring M4 are formed over the interlayer insulating film IL4 using the same technique as used for forming the via V1 and the second wiring M2. In addition, the material of the interlayer insulating film IL3 and the interlayer insulating film IL4 are formed from the same material as the material from which the interlayer insulating film IL2 is formed.

Figure 4:
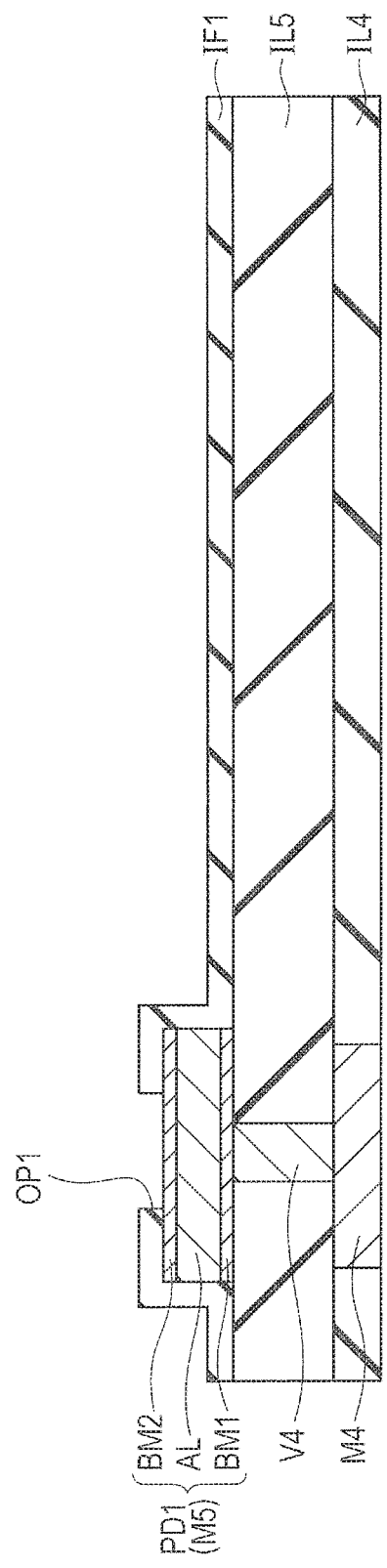
FIG. 4 shows a sectional view during a manufacturing process of the semiconductor device of Embodiment 1.

FIG. 4 shows formation processes of the interlayer insulating film IL5, the via V4, the fifth wiring M5, the insulating film IF1, and the opening OP1.

First, over the interlayer insulating film IL4, the interlayer insulating film IL5 is so formed as to cover the fourth wiring M4. The interlayer insulating film IF5 is an insulating film formed from a non-organic material and, for example, containing silicon oxide to which silicon oxide or fluoride is added. Moreover, over a surface of the fourth wiring M4, there is formed a barrier insulating film having a function to prevent copper from diffusing and containing, for example, silicon carbon nitride (not shown here).

Next, a via hole is formed in the interlayer insulating film IL5 using the photolithography technique and the dry etching technique. Then, the via V4 is formed by embedding, for example, a metal film of tungsten in the via hole. This via V4 is coupled to an upper surface of the fourth wiring M4.

Next, the fifth wiring M5 is formed over the interlayer insulating film IL5. First, using the CVD method or the sputtering method, over the interlayer insulating film IL5, the barrier metal film BM1, the conductive film AL, and the barrier metal film BM2 are laminated one by one. Then, the fifth wiring M5 is formed by patterning, using the photolithography technique and the dry etching technique. The fifth wirings M5 are formed in the uppermost layer of a multilayer wiring layer, and part of them serves as a first pad electrode PD1. The fifth wiring M5 (the first pad electrode PD1) is coupled to the upper surface of the via V4.

Here, the barrier metal film BM1 and the barrier metal film BM2 include a laminated film of titanium nitride or titanium nitride and titanium, respectively. Moreover, the conductive film AL includes aluminum as its principal component. A film thickness of the barrier metal film BM1 is about 30 to 100 nm. Further, a film thickness of the conductive film AL is about 300 to 500 nm, and a film thickness of the barrier metal film BM2 is about 30 to 100 nm. Also, the barrier metal film BM2 may not be formed. In the present embodiment, however, a case where the barrier metal film BM2 is formed will be explained.

Next, the insulating film IF1 is formed over the first pad electrode PD1 and the interlayer insulating film IL5. The insulating film IF1 is formed using the PECVD method, being the insulating film formed from a non-organic material, and including, for example, silicon nitride or oxy-silicon nitride. Moreover, the insulating film IF1 may be a laminated film where a silicon oxide film is formed first and then a silicon nitride film is formed over the silicon oxide film. In either case, the film thickness of the insulating film IF1 is about 500 to 800 nm.

Next, an opening OP1 is formed in the insulating film IF1 using the photolithography technique and the dry etching technique. Accordingly, at the bottom of the opening OP1, part of an upper surface of the first pad electrode PD1 is exposed.

In this regard, at the exposed first pad electrode PD1, the barrier metal film BN2 may be removed. That is, the opening OP1 may be so formed as to reach the conductive film AL. The barrier metal film BM2 may not necessarily be removed. However, in order to further reduce resistance between the re-wiring RW3 and the first pad electrode PD1, it is effective to remove the barrier metal film BM2. In the present embodiment, a case where the opening OP1 is formed without removing the barrier metal film BM2 will be shown.

With the above process, there are provided: the semiconductor substrate SB; the multilayer wiring layer and the interlayer insulating film IL5 formed over the semiconductor substrate SB; the first pad electrode PD1 formed in an uppermost wiring layer of the multilayer wiring layer; and the insulating film IF1 formed over the first pad electrode PD1 and over the interlayer insulating film IL5 and, at the same time, formed from the non-organic material.

Figure 5:
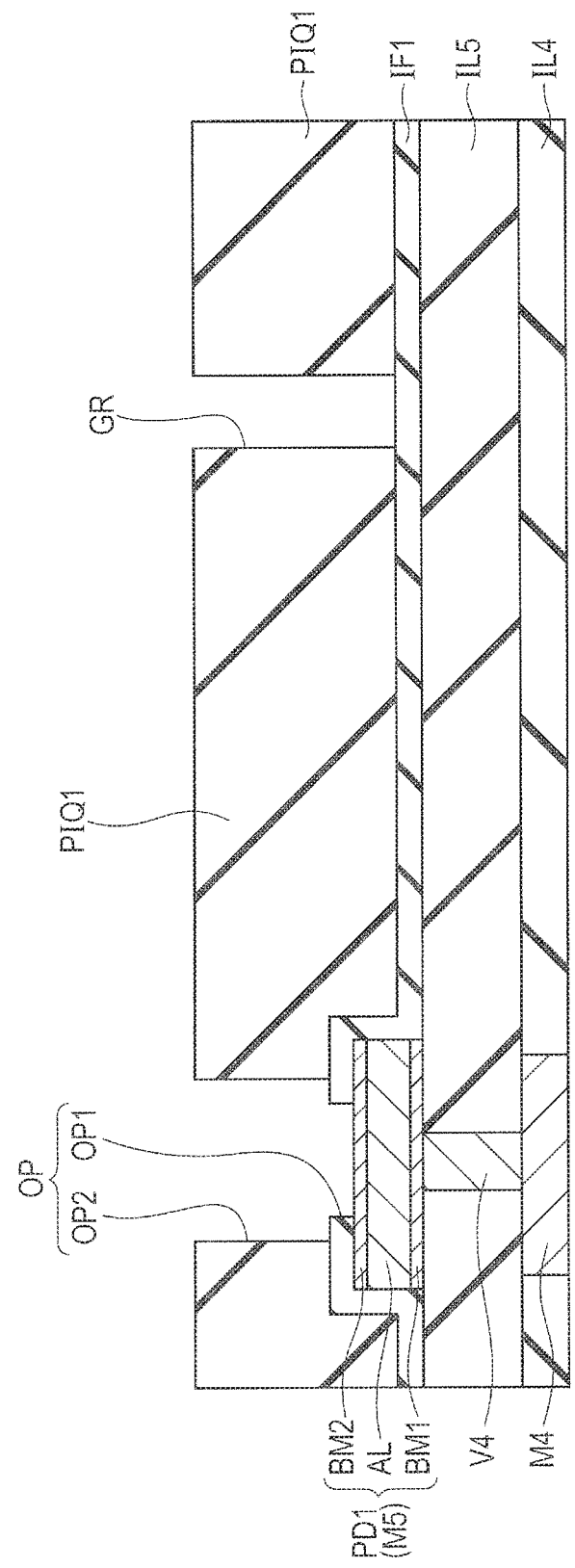
FIG. 5 shows a sectional view during a manufacturing process of the semiconductor device following that shown in FIG. 4.

FIG. 5 shows formation processes of the organic insulating film PIQ1, an opening OP2, and the groove GR.

First, the organic insulating film PIQ1 is formed over the first pad electrode PD1 and the insulating film IF1. The organic insulating film PIQ1 is an organic resin film formed using the painting method and, for example, includes photosensitive polyimide. A film thickness of the organic insulating film PIQ1 is about 3 to 7 μm. Then, thermal treatment is applied to the organic insulating film PIQ1 to be cured.

Next, the organic insulating film PIQ1 is patterned by being selectively exposed and developed. Thus, in the organic insulating film PIQ1, there are formed the opening OP reaching the first pad electrode PD1 and the groove GR reaching the insulating film IF1. In addition, it is preferable for the opening OP2 to be formed with a diameter larger than that of the opening OP1 so as to be in communication with the opening OP1. In this regard, it is important that the groove GR is so formed as to penetrate the organic insulating film PIQ1 so that part of the insulating film IF1 is exposed at the bottom of the groove GR. In the present embodiment, since the formation process of the opening OP2 and the formation process of the groove GR can be performed at the same time, the manufacturing process can be simplified.

Figure 6:
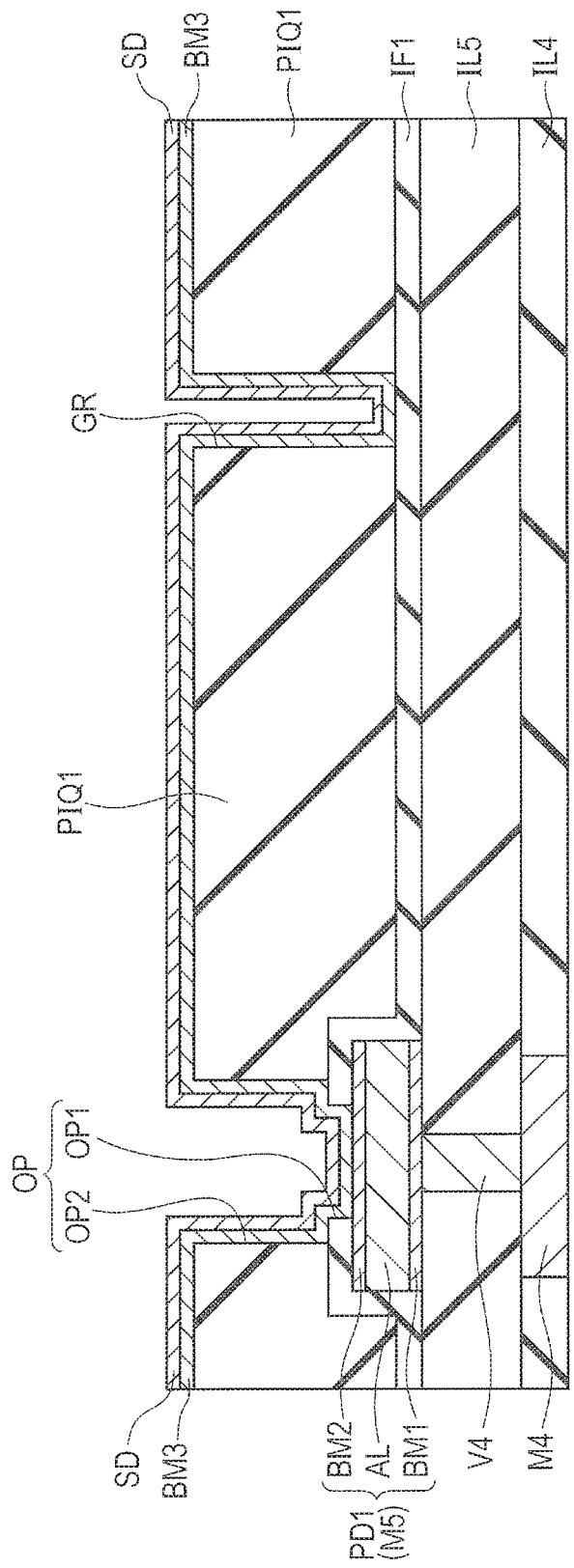
FIG. 6 shows a sectional view during a manufacturing process of the semiconductor device following that shown in FIG. 5.

FIG. 6 shows formation processes of a barrier metal film BM3 and a seed layer SD.

First, over the organic insulating film PIQ1, over the first pad electrode PD1 in the opening OP2, and over the insulating film IF1 in the groove, the barrier metal film BM3 is formed using the sputtering method. The barrier metal film BM3 is a conductive film which contains titanium, tantalum, or chromium, for example, and has a function to prevent diffusion of the conductive film PF1 (copper). The barrier metal film BM3 may be a single-layer film of the above material. Alternatively, it may be a laminated film made by forming a metal nitride film of titanium nitride or nitride tantalum over the single-layer film. In either case, the film thickness of the barrier metal film BM3 is about 50 to 100 nm.

Here, at the bottom of the groove GR, it is important that the barrier metal film BM3 is formed over the insulating film IF1 which is formed from a non-organic material. That is, in a plan view, in an area between the re-wiring RW1 and a re-wiring RW2 to be formed in a later process, it is important that barrier metal film BM3 is formed not only over the organic insulating film PIQ1 but also over the insulating film IF1 in an area between the re-wiring RW1 and the re-wiring RW2 which are formed in a next process.

After the barrier metal film BM3 has been formed, using the sputtering method, a seed layer SD is formed over the barrier metal film BM3. The seed layer SD includes the same material as that of a conductive film PF1 of the subsequent process, and contains, for example, copper. In addition, a film thickness of the seed layer SD is about 200 to 400 nm.

Figure 7:
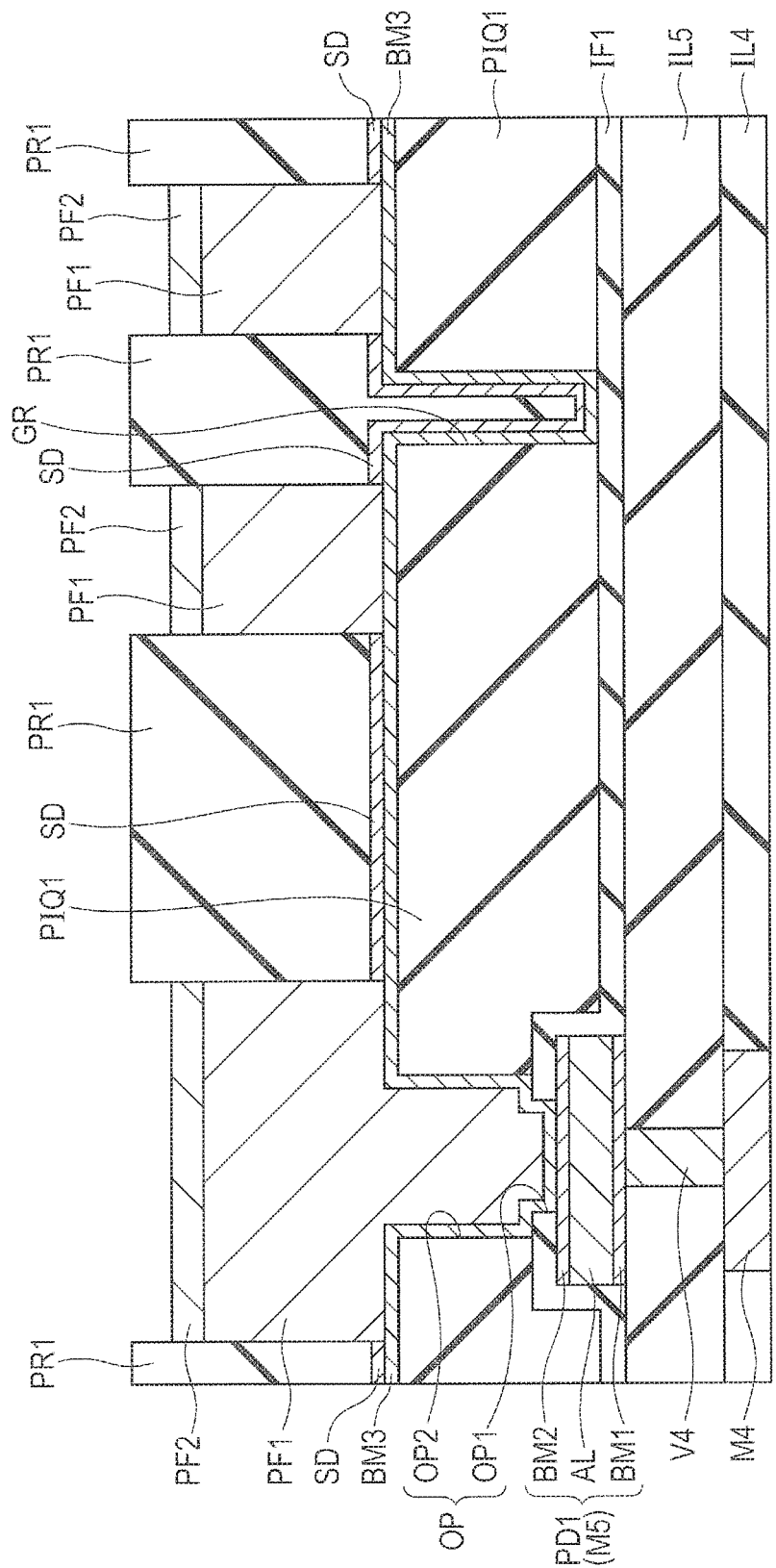
FIG. 7 shows a sectional view during a manufacturing process of the semiconductor device following that shown in FIG. 6.

FIG. 7 shows formation processes of a resist pattern PR1, the conductive film PF1, and the conductive film PF2.

First, over the barrier metal film BM3 through the seed layer SD, a resist pattern PR1 in which an area where re-wirings RW1 to RW5 are formed is opened over the barrier metal film BM3 through the seed layer SD. Next, over the seed layer SD exposed from the resist pattern PR1, using the plating method, the conductive film PF1 and the conductive film PF2 are formed one by one. As a result, the seed layer SD is formed integrally with the conductive film PF1.

The conductive film PF1 is a film which is included in the main part of the re-wirings RW1 to RW5, contains a material whose sheet resistance is lower than that of the conductive film PF2 for the reduction in resistance, and contains, for example, copper. Moreover, a film thickness of the conductive film PF1 is thicker than a film thickness of the conductive film PF2, and is about 4 to 7 μm.

The conductive film PF2 includes a material different from that of the conductive film PF1, and it contain nickel, for example. Moreover, the conductive film PF2 may be formed as a laminated film of a nickel film and a gold film. In either case, the film thickness of the conductive film PF2 is about 1 to 2 μm.

Figure 8:
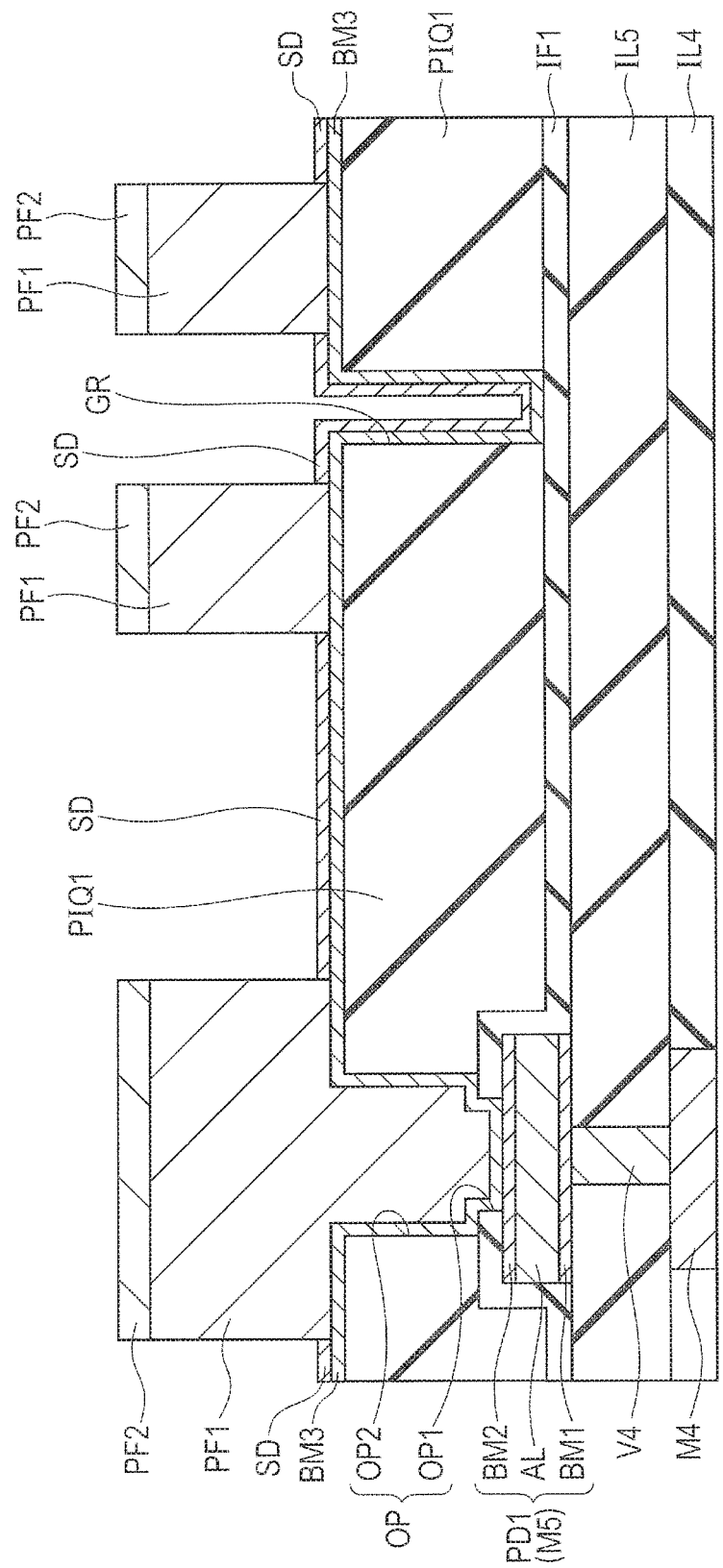
FIG. 8 shows a sectional view during a manufacturing process of the semiconductor device following that shown in FIG. 7.

FIG. 8 shows a removal process of the resist pattern PR1.

The resist pattern PR1 is removed by asking or an exfoliation process using wet etching. As a result, in an area (an area where the conductive film PF1 and the conductive film PF2 are not formed) exposed from the conductive film PF1 and the conductive film PF2, the seed layer SD is exposed.

Figure 9:
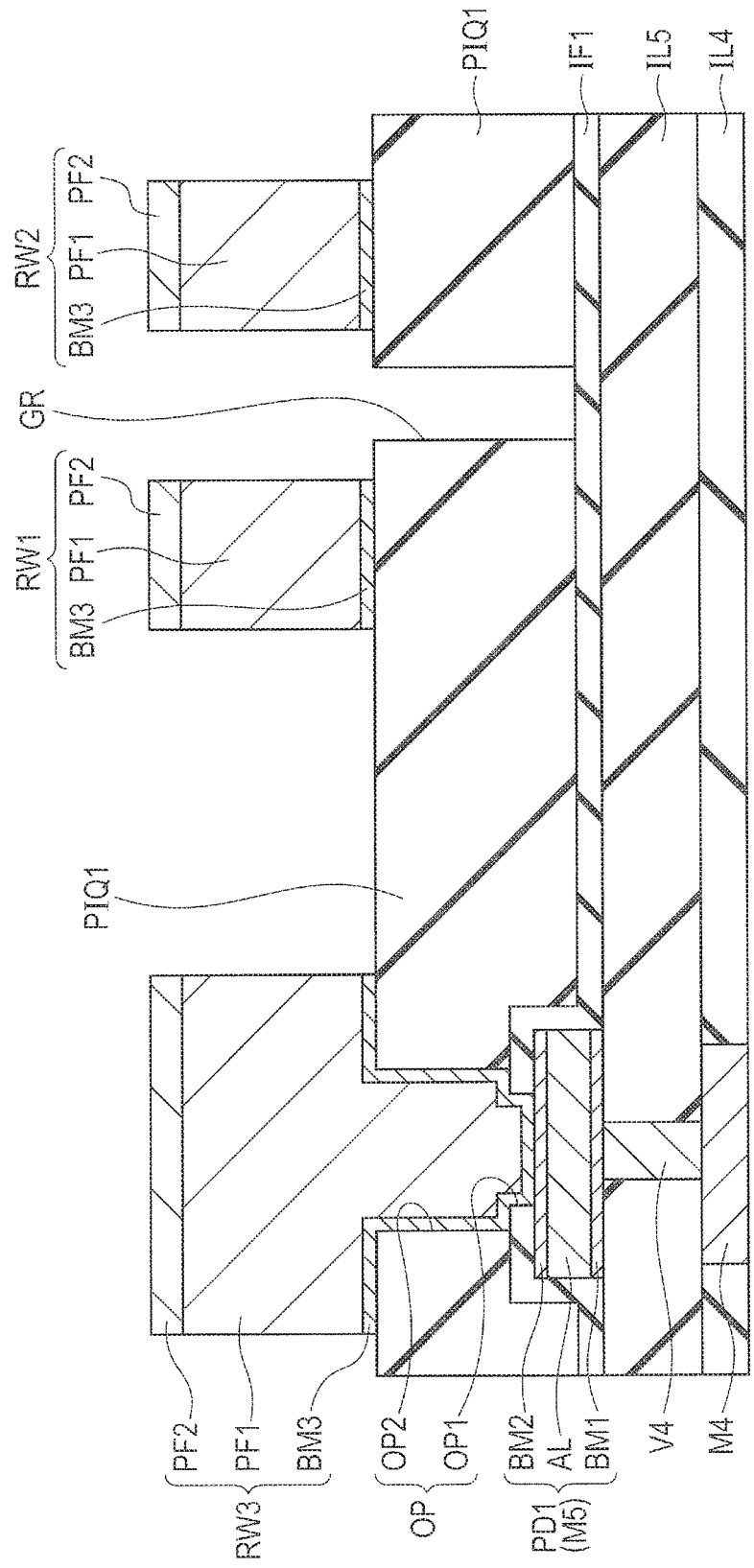
FIG. 9 shows a sectional view during a manufacturing process of the semiconductor device following that shown in FIG. 8.

FIG. 9 shows removal processes of the seed layer SD and the barrier metal film BM3, and formation processes of the re-wirings RW1 to RW3.

First, the exposed seed layer SD is removed by the wet etching technique or the dry etching technique. As a result, the barrier metal film BM3 formed under the seed layer SD is exposed. Then, the barrier metal film BM3 is selectively left under each conductive film PF1 by removing the exposed barrier metal film BM3 by the wet etching technique. Thus, there are formed the re-wirings RW1 to RW3 having the conductive film PF1, the conductive film PF2, and the barrier metal film BM3.

After the process of FIG. 9, the organic insulating film PIQ2, the opening OP3, and the terminal ET for external connection are formed. In this manner, the semiconductor device shown in FIG. 2 is manufactured.

First, over the organic insulating film PIQ1, the organic insulating film PIQ2 is so formed as to cover the re-wirings RW1 to RW3. The organic insulating film PIQ2 includes the same material as that of the organic insulating film PIQ1. Here, the organic insulating film PIQ2 is embedded in the groove GR.

Next, the organic insulating film PIQ2 is patterned by being selectively exposed and developed. As a result, the opening OP3 is formed in the organic insulating film PIQ2. The re-wiring RW3 in an area exposed from this opening OP3 serves as a second pad electrode PD2. The second pad electrode PD2 is an area for coupling with the terminal ET for external connection. Then, the terminal ET for external connection which includes a wire bonding or a bump electrode is formed over the second pad electrode PD2. In addition, in the present embodiment, a case where the wire bonding is used as the terminal ET for external connection is shown.

Moreover, as described above, the organic insulating film PIQ2 may not necessarily be formed. In that case, part of the area of the rewiring RW3 to which the terminal ET for external connection is coupled is regarded as the second pad electrode PD2.

COMPARATIVE EXAMPLE

Figure 18:
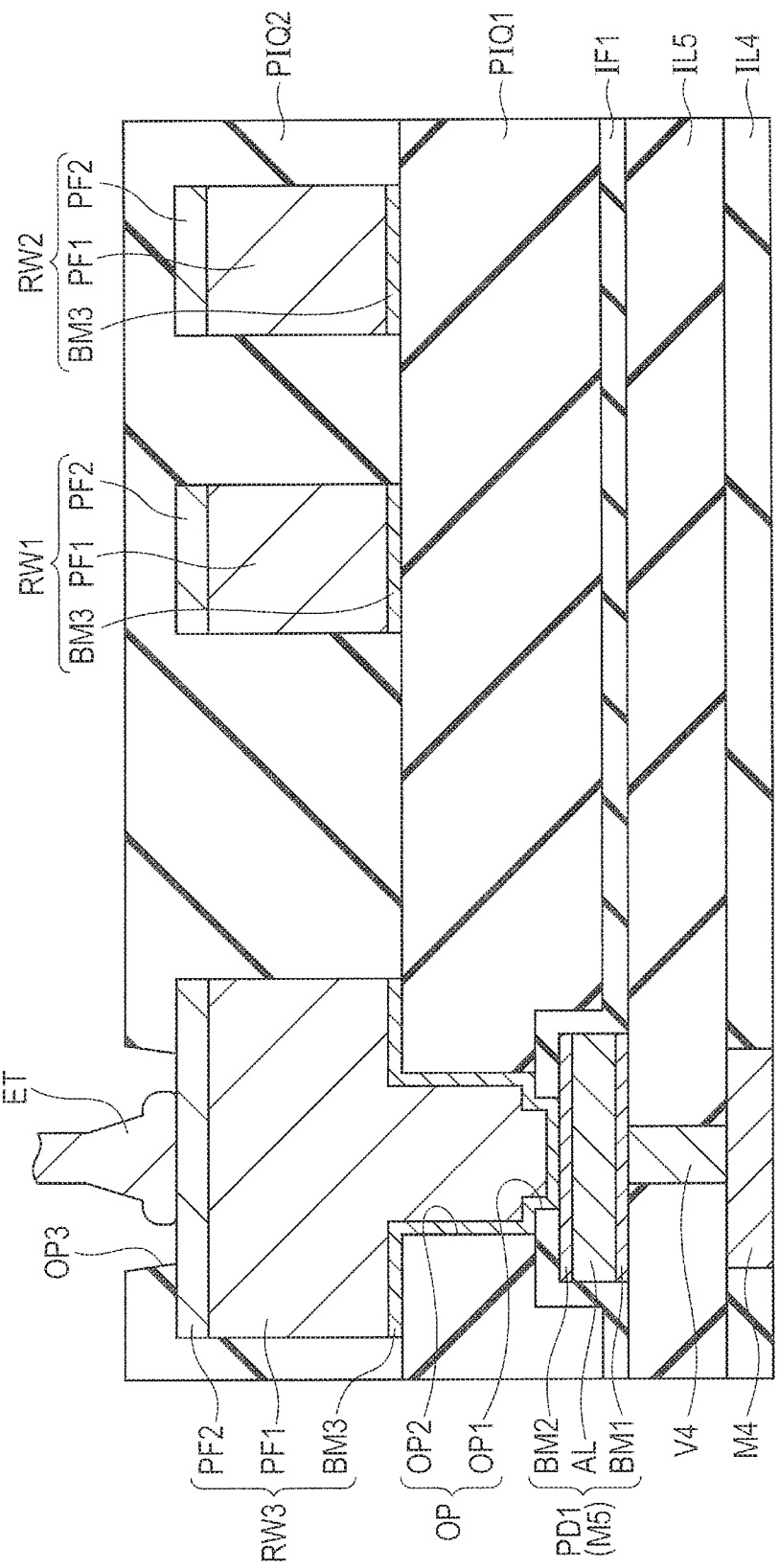
FIG. 18 is a sectional view of a semiconductor device of a comparative example.
Figure 19:
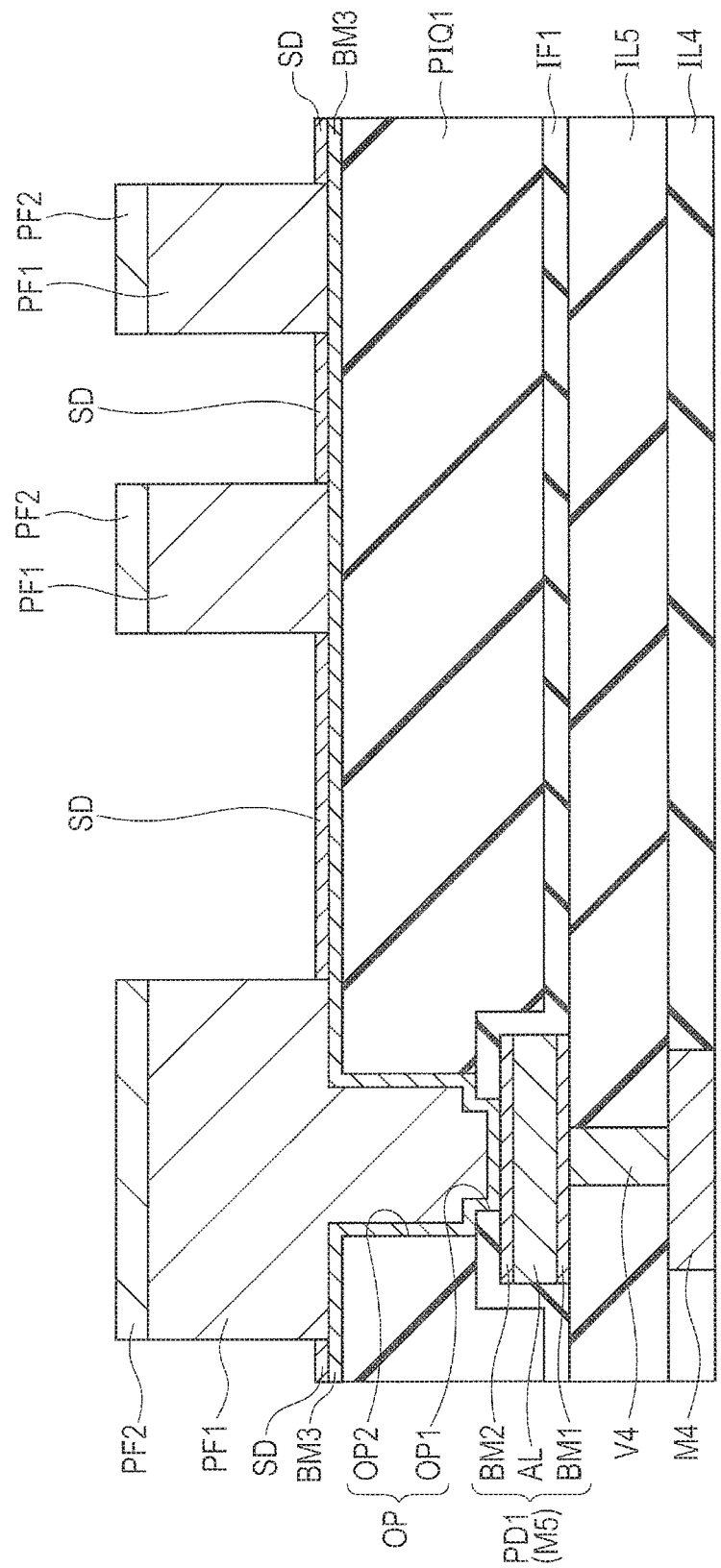
FIG. 19 shows a sectional view during a manufacturing process of the semiconductor device of the comparative example.
Figure 20:
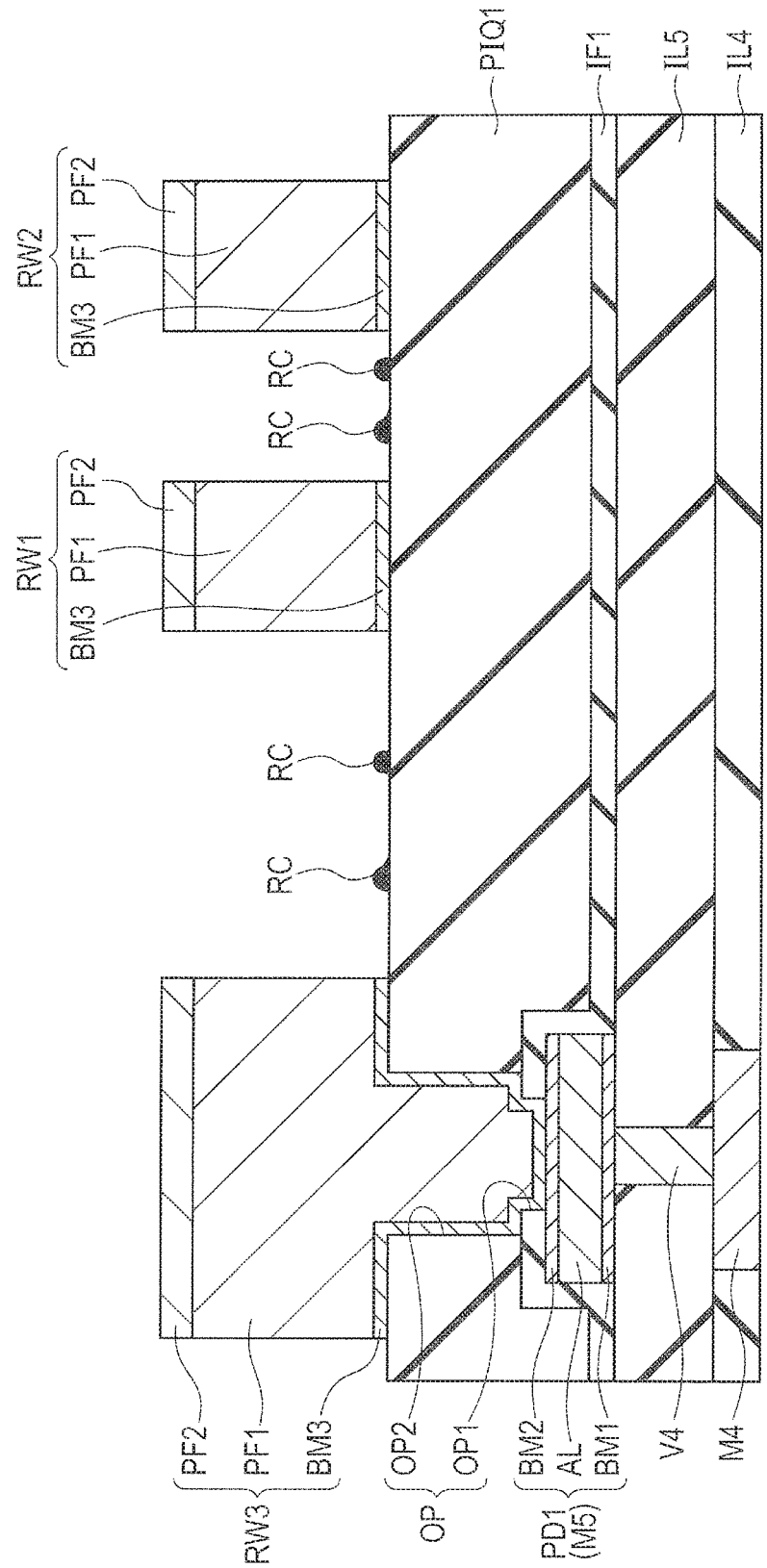
FIG. 20 shows a sectional view during a manufacturing process of the semiconductor device following that shown in FIG. 19.

With reference to FIGS. 18 to 20, hereafter, a semiconductor device of a comparative example that the inventors of the present invention have discussed will be explained.

FIG. 18 is a sectional view of the semiconductor device of the comparative example, and like the present embodiment, corresponds to a sectional view taken along line A-A of FIG. 1. FIGS. 19 and 20 show sectional views during manufacturing processes of the re-wirings RW1 to RW3.

As shown in FIG. 18, unlike the present embodiment, the groove GR is not formed in the organic insulating film PIQ1 in the comparative example. That is, in a plan view, the groove GR is not formed between the neighboring re-wiring RW1 and the rewiring RW2. In addition, like the present embodiment, in the comparative example also, the re-wiring RW1 and the re-wiring RW2 are the re-wirings coupled to electric potential different from each other.

Hereafter, a manufacturing process being a principal part of the semiconductor device of the comparative example and its problem will be explained.

FIG. 19 shows a manufacturing process corresponding to that shown in FIG. 8 of the present embodiment, and FIG. 20 shows a manufacturing process corresponding to that shown in FIG. 9 of the present embodiment.

As shown in FIG. 19, over the organic insulating film PIQ1, using the sputtering method, the barrier metal film BM3 and the seed layer SD are formed. Then, over the seed layer SD, using the plating method, the conductive film PF1 and the conductive film PF2 are formed one by one.

Next, as shown in FIG. 20, in an area where the conductive film PF1 is not formed, the seed layer SD and the barrier metal film BM3 are removed. At this time, part of the barrier metal film BM3 might be left over the organic insulating film PIQ1. As a result, between the re-wiring RW1 and the re-wiring RW2, there occurred a problem of life of the HAST test being deteriorated. The deterioration of the life of the HAST test means that the insulation resistance between the re-wiring RW1 and the re-wiring RW2 has been deteriorated, and also means that the leakage current between the re-wiring RW1 and the re-wiring RW2 increases as time passes. That is, the reliability of the semiconductor device is lowered.

Moreover, in the HAST test which the present inventors conducted, when a distance between the rewiring RW1 and the rewiring RW2 was 15 μm, there was no judgment indicating failure. However, when the above distance was 12 µm or less, the judgment indicating failure increased remarkably.

With respect to the cause for the above problem, what the present inventors have discussed will be described below. Here, an explanation will be given as to a case where titanium is used as part of a material for the barrier metal film BM3 and polyimide containing carbon such as C—H combination is used as a material for the organic insulating film PIQ1.

Titanium of the barrier metal film BM3 is formed over the organic insulating film PIQ1 by the sputtering method. At this time, part of the titanium reacts with carbon contained in the polyimide, and a reaction product RC such as titanium carbide etc. may be formed. The reason is as follows. At an early stage of a process where titanium is deposited by the sputtering method, a gas such as argon is introduced into a chamber. Because a surface of polyimide is exposed to argon, the C—H combination of the surface of polyimide becomes weak. Therefore, the titanium is in such a state that it easily reacts with the polyimide.

In the manufacturing process, since generation of such a reaction product RC is not expected, it is difficult to completely remove the reaction product RC with the usual wet etching for removing titanium. In addition, this reaction product RC has conductivity. Therefore, if the reaction product RC remains between the neighboring re-wiring RW1 and the re-wiring RW2, a leakage current tends to be generated.

Therefore, when using the organic insulating film PIQ1 including polyimide etc. for the re-wiring structure, it is important to suppress generation of such a reaction product RC as much as possible, or even when the reaction product RC has been produced, it is important not to generate the leakage current between the re-wiring RW1 and the re-wiring RW2 neighboring to each other.

<Main Features of Semiconductor Device>

Hereafter, main features of the semiconductor device of the present embodiment will be explained.

As explained with use of FIGS. 1 and 2 above, according to the present embodiment, in the organic insulating film PIQ1 between the re-wiring RW1 and the re-wiring RW2, the groove GR is so formed as to be along the direction in which the re-wiring RW1 and the re-wiring RW2 extend. The groove GR penetrates the organic insulating film PIQ1 and reaches the insulating film IF1. The insulating film IF1 is a film formed from a non-organic material. In the present specification, the non-organic material means a material which does not contain a reactant carbon atom in the formation of the organic insulating film PIQ1. Therefore, as in the above comparative example, over the insulating film IF1, there is not formed the reaction product RC which might be produced by a reaction of titanium included in the barrier metal film BM3 and polyimide included in the organic insulating film PIQ1. That is, it is possible that the reaction product RC is formed over a side portion of the groove GR. However, at the bottom of the groove GR, since the insulating film IF1 exists, the reaction product RC is not formed over the insulating film IF1. In other words, a route of the leakage current between the re-wiring RW1 and the re-wiring RW2 is separated by the insulating film IF1. As a result, the semiconductor device of the present embodiment is capable of suppressing the deterioration of the life of the HAST test resulting from the reaction product RC between the re-wiring RW1 and the re-wiring RW2 as well as the increase in the leakage current. Therefore, the reliability of the semiconductor device can be improved.

Moreover, as in the case of the re-wirings RW1 and RW2 which are most minutely processed re-wirings, the above problem tends to occur between the neighboring re-wirings whose distance is particularly short. According to the present embodiment, the distance between the re-wiring RW1 and the re-wiring RW2 is shown as about the same as a width of the re-wiring RW1 or a width of the re-wiring RW2. Therefore, a width of the groove GR provided between the re-wiring RW1 and the re-wiring RW2 is smaller than the width of the re-wiring RW1 or the width of re-wiring RW2. In addition, needless to say, the width of the re-wiring RW1 and the width of the re-wiring RW2 can be greater than the distance between the re-wiring RW1 and the re-wiring RW2.

Moreover, as described above, according to the study of the present inventors, when the distance between the re-wiring RW1 and the re-wiring RW2 was 15 µm, there was no poor judgment. However, when the above distance was 12 µm or less, the poor judgment increased remarkably. Specifically, When the distance between the neighboring re-wirings RW1 and RW2 was 15 µm, leak did not occur even when the HAST test was conducted for 2000 hours. On the other hand, for example, when the distance between the neighboring re-wirings RW1 and RW2 was 12 µm or less, the leak occurred in the HAST test for about 500 hours. Therefore, it is effective to form the groove GR in an area where the distance between the neighboring re-wirings is 12 µm or less.

For example, it is conceivable that the groove GR is formed, in a plan view, in an area other than the one between the re-wiring RW1 and the re-wiring RW2, that is, for example, an area between the re-wiring RW3 and the re-wiring RW1. Here, in a cross-section along line A-A of FIG. 1, a distance between the re-wiring RW3 and the re-wiring RW1 is greater than 12 µm and is, for example, 15 µm. In such an area, since the distance between the neighboring re-wirings is long enough, even when the reaction product RC is formed over the organic insulating film PIQ1, the problem of the life of the HAST test and the problem of the leakage current do not become remarkable. For this reason, it is not necessary to form the groove GR in the area between the re-wiring RW3 and the re-wiring RW1. In particular, according to the present embodiment, part of the organic insulating film PIQ1 is removed and the insulating film IF1 is exposed at the bottom of the groove GR. As a result, moisture etc. may enter from the outside of the semiconductor device through the groove GR of the semiconductor device. For this reason, if the groove GR is formed carelessly, it may rather lower the overall reliability of the semiconductor device. Therefore, it is preferable that the groove GR should be provided according to a degree of necessity. That is, for example, the groove GR is formed in the area between the re-wiring RW1 and the re-wiring RW2 but is not provided between the re-wiring RW3 and the re-wiring RW1.

Further, according to the present embodiment, the organic insulating film PIQ2 may not necessarily be formed. However, in order to achieve higher reliability, it is preferable to form the organic insulating film PIQ2. In addition, it is preferable to embed the organic insulating film PIQ2 inside the groove GR. As described above, although there is a possibility that moisture etc. may enter from the outside of the semiconductor device through the groove GR, the case where the organic insulating film PIQ2 is embedded in the groove GR can prevent the entrance of the above moisture more reliably than the case where the insulating film IF1 alone is formed at the bottom of the groove GR.

Further, as shown in FIG. 5, the groove GR and the opening OP2 are formed in the same process. Since it is not necessary to newly add a mask and perform an individual etching process etc. for forming the groove GR, it becomes possible to simplify the manufacturing process.

Thus, according to the present embodiment, the reliability of the semiconductor device can be improved by forming the groove GR in the organic insulating film PIQ1 between the re-wiring RW1 and RW2 reaching the insulating film IF1 of the non-organic material in a plan view.

Embodiment 2

With reference to FIGS. 10 to 13, a semiconductor device according to Embodiment 2 will be explained below.

Figure 10:
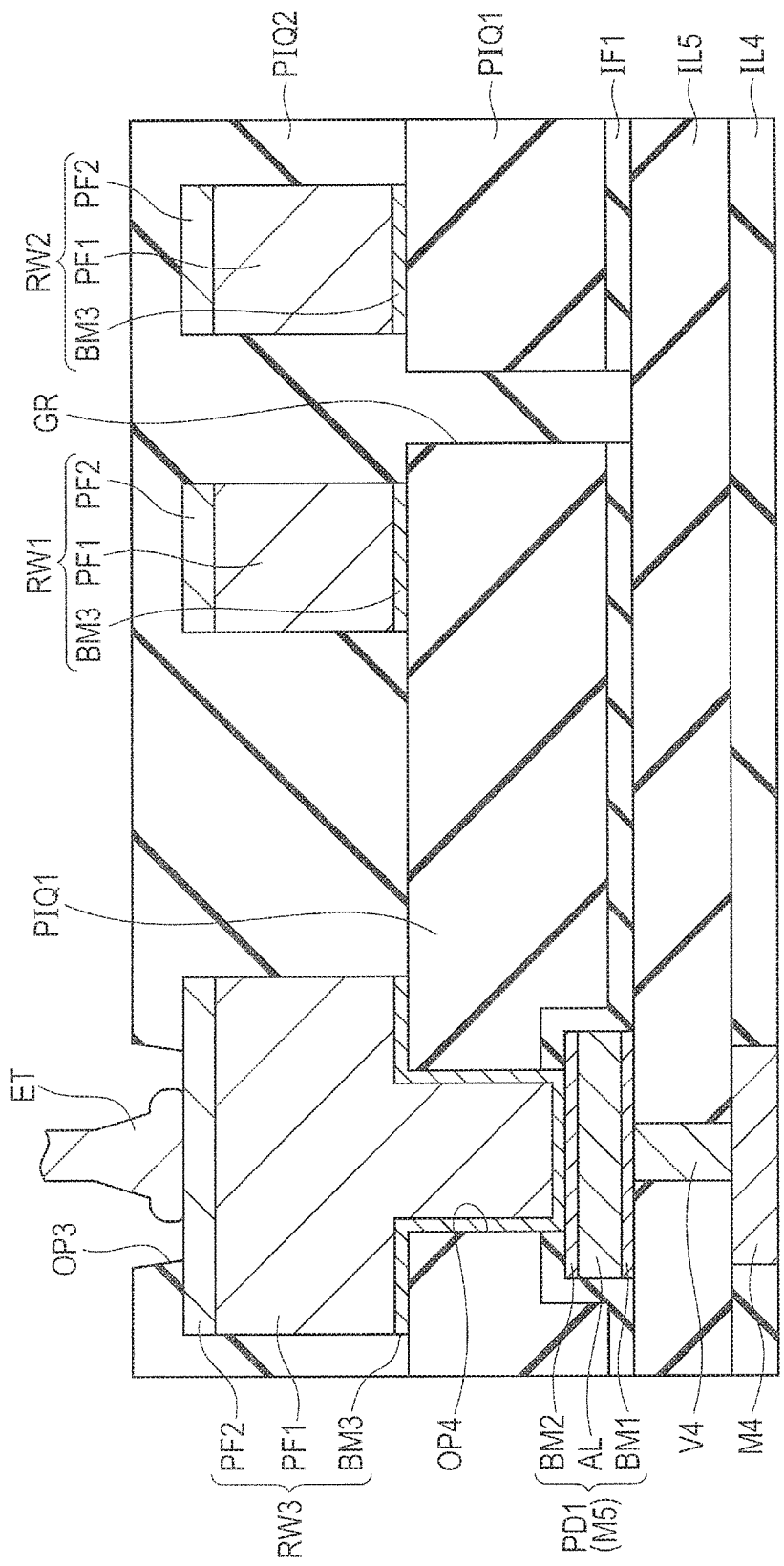
FIG. 10 is a sectional view of a semiconductor device of Embodiment 2.
Figure 13:
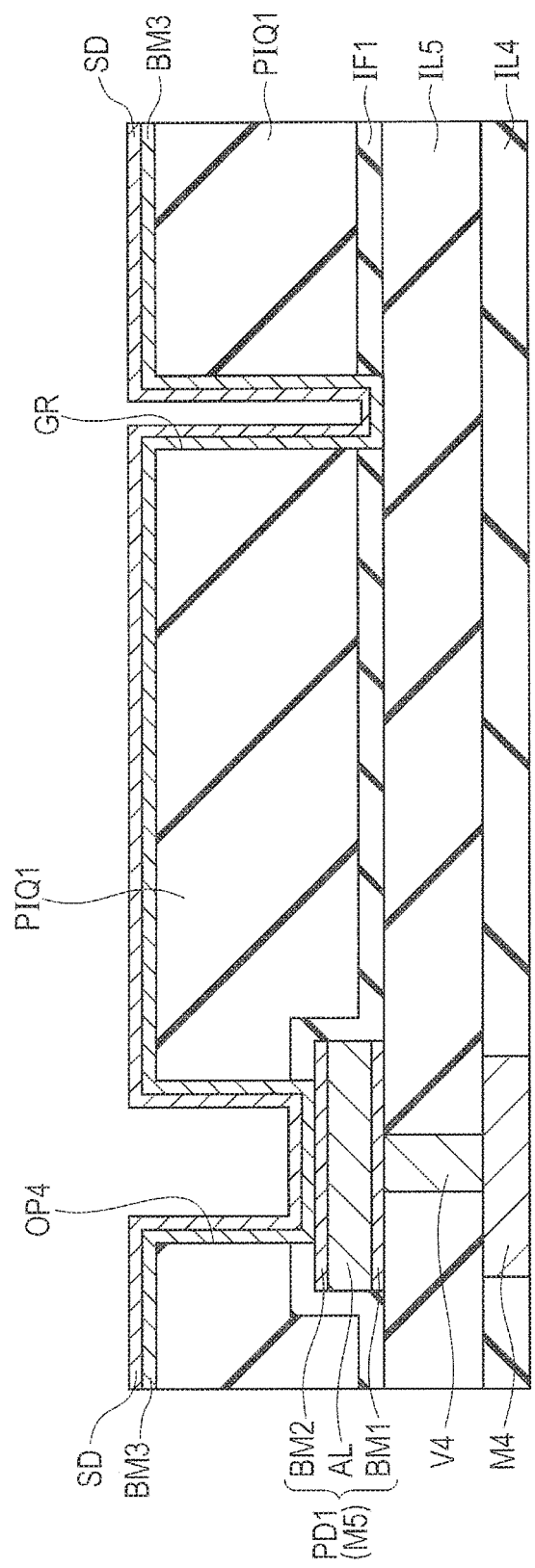
FIG. 13 shows a sectional view during a manufacturing process of the semiconductor device following that shown in FIG. 12.

FIG. 10 is a sectional view of a principal part of a semiconductor chip CHP and is, like FIG. 2 of Embodiment 1, a sectional view taken along line A-A of FIG. 1. FIGS. 11 to 13 show sectional views during manufacturing processes of the semiconductor device of FIG. 10.

In Embodiment 1, the groove GR has been so formed as to penetrated the organic insulating film PIQ1 and to reach the insulating film IF1 formed from the non-organic material.

On the other hand, as shown in FIG. 10, in Embodiment 2, the groove GR is so formed as to penetrate the organic insulating film PIQ1 and the insulating film IF1 and to reach the interlayer insulating film IL5 formed from the non-organic material.

Hereafter, with reference to FIGS. 11 to 13, the feature of Embodiment 2 will be explained in detail.

FIG. 11 shows a manufacturing process corresponding to that shown in FIG. 4 of Embodiment 1. In Embodiment 2, formation processes of the interlayer insulating film IL5, the via V4, and the fifth wiring M5 are the same as those in Embodiment 1. According to Embodiment 1, the insulating film IF1 is formed over the first pad electrode PD1 and the interlayer insulating film IL5, and the opening OP1 is formed in the insulating film IF1 after that. On the other hand, according to Embodiment 2, although the insulating film IF1 is formed over the first pad electrode PD1 and the interlayer insulating film IL5, the opening OP1 is not formed in the insulating film IF1 after that.

FIG. 12 shows a manufacturing process corresponding to that shown in FIG. 5 of Embodiment 1, and shows formation processes of the organic insulating film PIQ1, the opening OP4, and the groove GR.

First, the organic insulating film PIQ1 is formed over the insulating film IF1. Next, the organic insulating film PIQ1 is patterned by being selectively exposed and developed. As a result, part of the insulating film IF1 is exposed from the organic insulating film PIQ1. Subsequently, by the dry etching technique, the insulating film IF1 exposed from the organic insulating film PIQ1 is removed, using the patterned organic insulating film PIQ1 as a mask. Consequently, there are formed an opening OP4 penetrating the organic insulating film PIQ1 and the insulating film IF1 and reaching the first pad electrode PD1 as well as the groove GR penetrating the organic insulating film PIQ1 and the insulating film IF1 and reaching the interlayer insulating film IL5.

FIG. 13 shows a manufacturing process corresponding to that shown in FIG. 6 of Embodiment 1, and shows formation processes of the barrier metal film BM3 and the seed layer SD.

First, over the organic insulating film OIQ1, over the first pad electrode PD1 in the opening OP4, and over the interlayer insulating film IL5 in the groove, with use of the sputtering method, the barrier metal film BM3 is formed. The formation process, film thickness, and material of the barrier metal film BM3 are the same as those of Embodiment 1. Next, using the sputtering method, the seed layer SD is formed over the barrier metal film BM3. The formation process and material of the seed layer SD are the same as those of Embodiment 1.

Subsequently, using the same technique as that of Embodiment 1, the re-wirings RW1 to RW5, the organic insulating film PIQ2, the opening OP3, and the terminal ET for external connection are formed. In this manner, the semiconductor device shown in FIG. 10 is manufactured.

According to Embodiment 1, the process of forming the opening OP1 in the insulating film IF1 and the process of forming the opening OP2 in the organic insulating film PIQ1 are performed independently.

On the other hand, according to Embodiment 2, the opening OP4 and the groove GR can be formed in the organic insulating film PIQ1 and in the insulating film IF1, respectively, in the same process. Therefore, the manufacturing process can be simplified and the manufacturing cost can be lowered.

Moreover, according to Embodiment 2, the groove GR is so formed as to penetrate the insulating film IF1 and to reach the interlayer insulating film IL5. In this regard, like the insulating film IF1, the interlayer insulating film IL5 is an insulating film formed from a non-organic material. Therefore, in Embodiment 2 also, as in Embodiment 1, since the interlayer insulating film IL5 of the non-organic material exists at the bottom of the groove GR, no reaction product RC is formed there. Therefore, the semiconductor device of Embodiment 2 is capable of suppressing the deterioration of the life of the HAST test resulting from the reaction product RC between the re-wirings RW1 and RW2 as well as the increase in the leakage current. Consequently, the reliability of the semiconductor device can be improved.

Also, as explained in FIG. 12, according to Embodiment 2, the insulating film IF1 is removed by the dry etching technique, using the organic insulating film PIQ1 as a mask. That is, the present embodiment differs from Embodiment 1 in that the surface of the organic insulating film PIQ1 is damaged by the plasma during dry etching. For the dry etching at this time, there are used a first gas that includes a molecule containing carbon and fluoride, a second gas containing oxygen, and a third gas that is an inactive gas. For example, the first gas is $CF_4$, the second gas is 02, and the third gas is Ar.

When a surface of the organic insulating film PIQ1 is damaged by the above dry etching, a curing layer is formed in an upper layer portion of the organic insulating film PIQ1. This curing layer may reduce adhesive characteristics of the organic insulating film PIQ1 and the barrier metal film BM3. Because of this, there is a possibility that adhesion characteristics of the organic insulating film PIQ1 and the re-wirings RW1 to RW5 may be reduced. Therefore, in respect of the reliability of a semiconductor device, the semiconductor device of Embodiment 1 is superior to the semiconductor device of Embodiment 2. However, depending on the specification of a product demanded by a market, the semiconductor device of Embodiment 2 may be satisfactory. In that case, as described above, in Embodiment 2, the manufacturing process can be more simplified and a manufacturing cost can be lowered than those in Embodiment 1.

Other features of Embodiment 2 are similar to those of Embodiment 1.

Embodiment 3

With reference to FIGS. 14 to 17, a semiconductor device according to Embodiment 3 will be explained.

Figure 14:
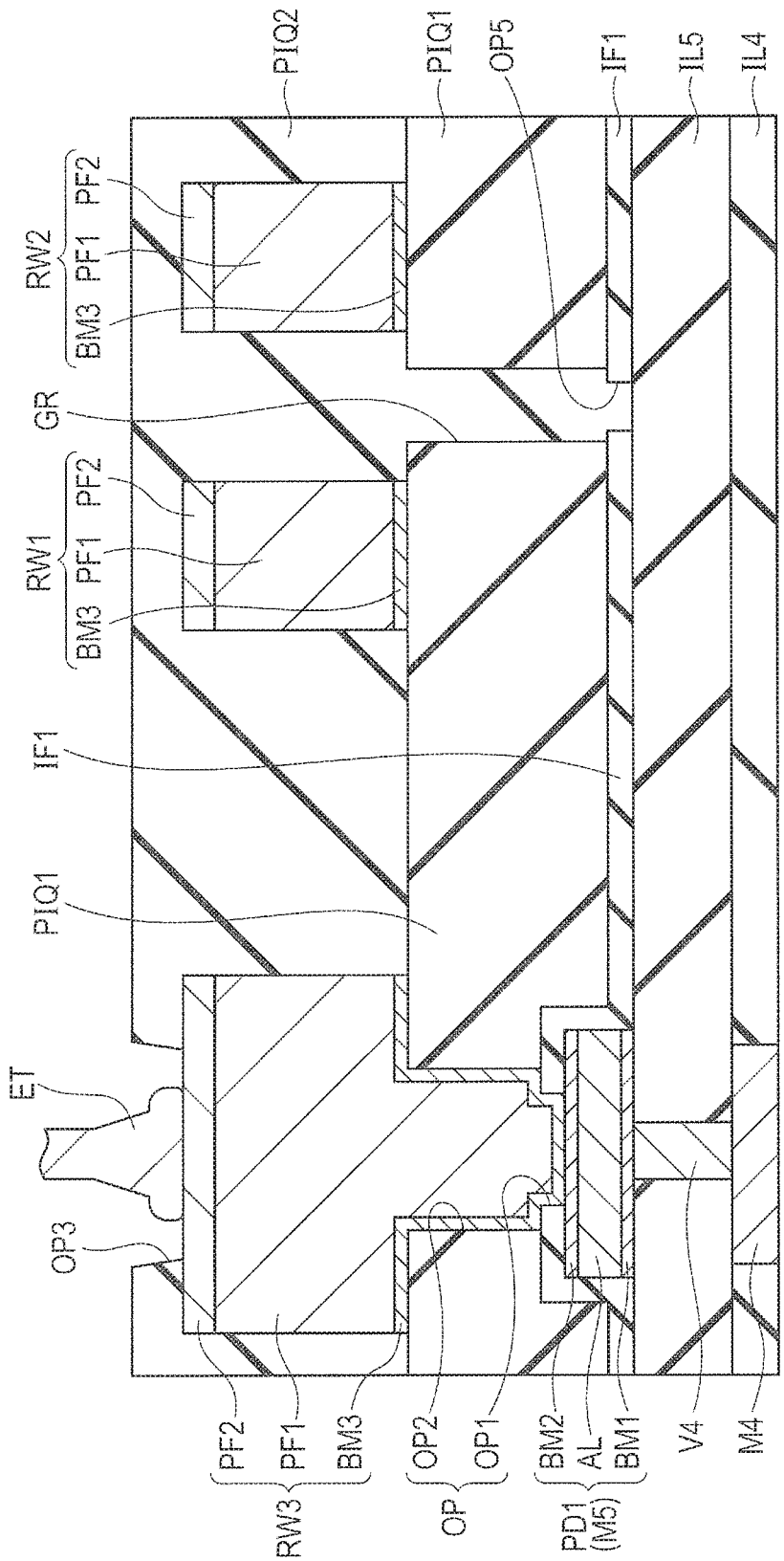
FIG. 14 is a sectional view of a semiconductor device of Embodiment 3.
Figure 15:
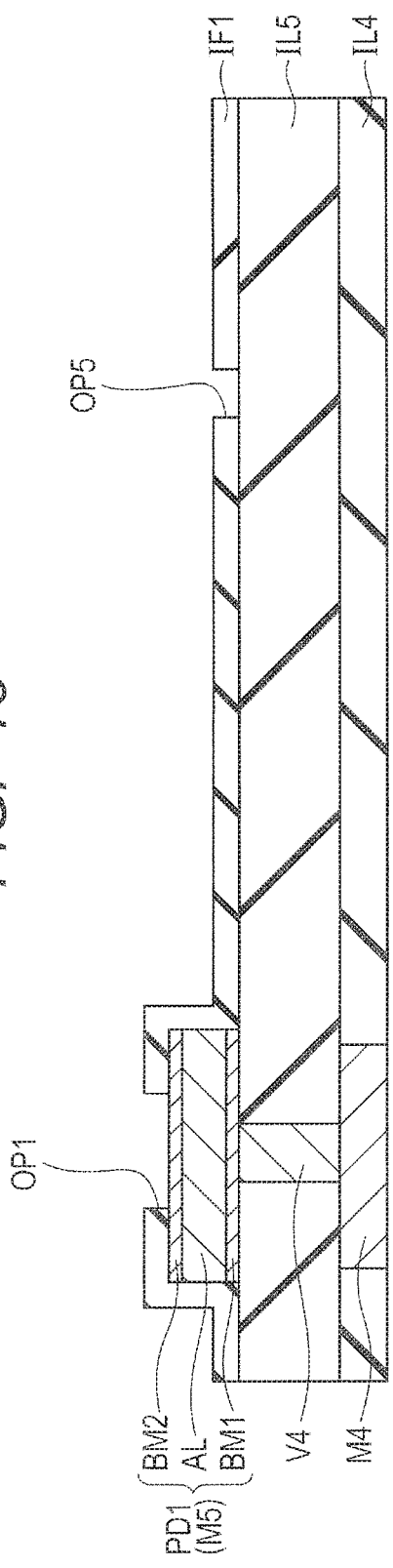
FIG. 15 shows a sectional view during a manufacturing process of the semiconductor device of Embodiment 3.
Figure 16:
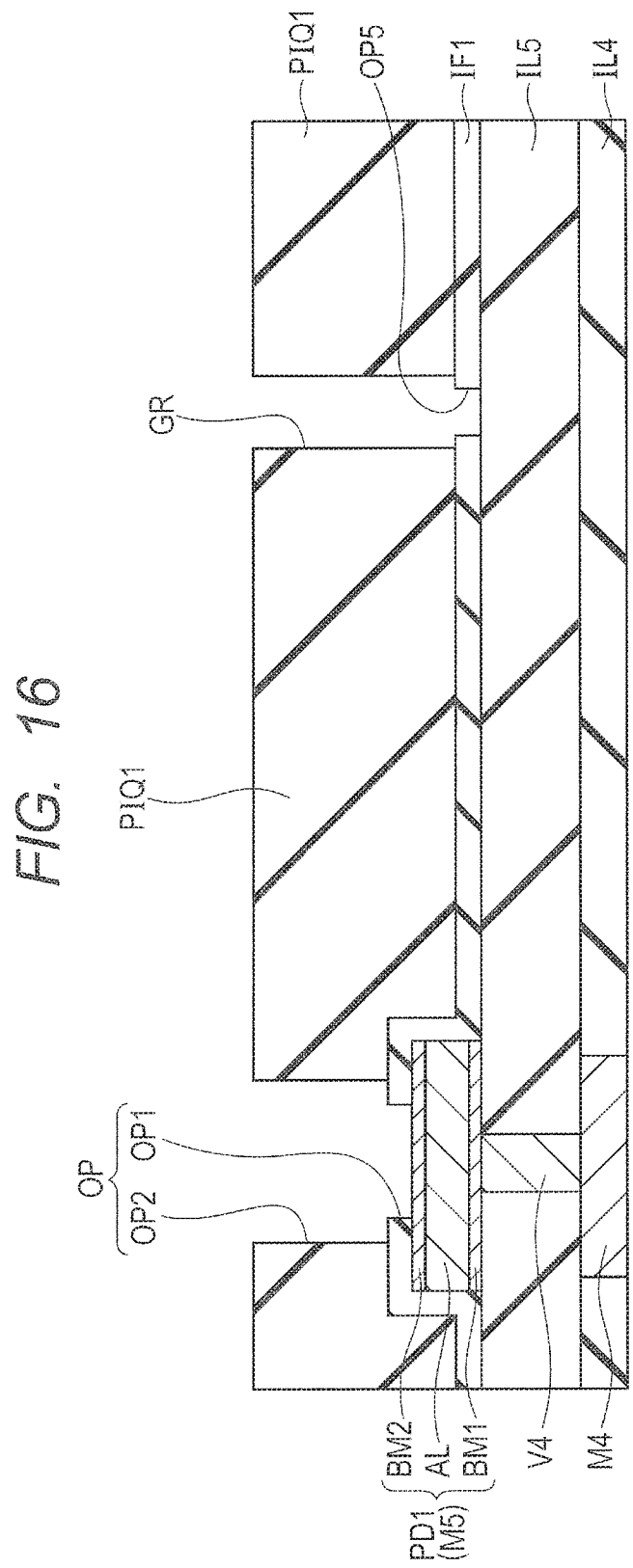
FIG. 16 shows a sectional view during a manufacturing process of the semiconductor device following that shown in FIG. 15.
Figure 17:
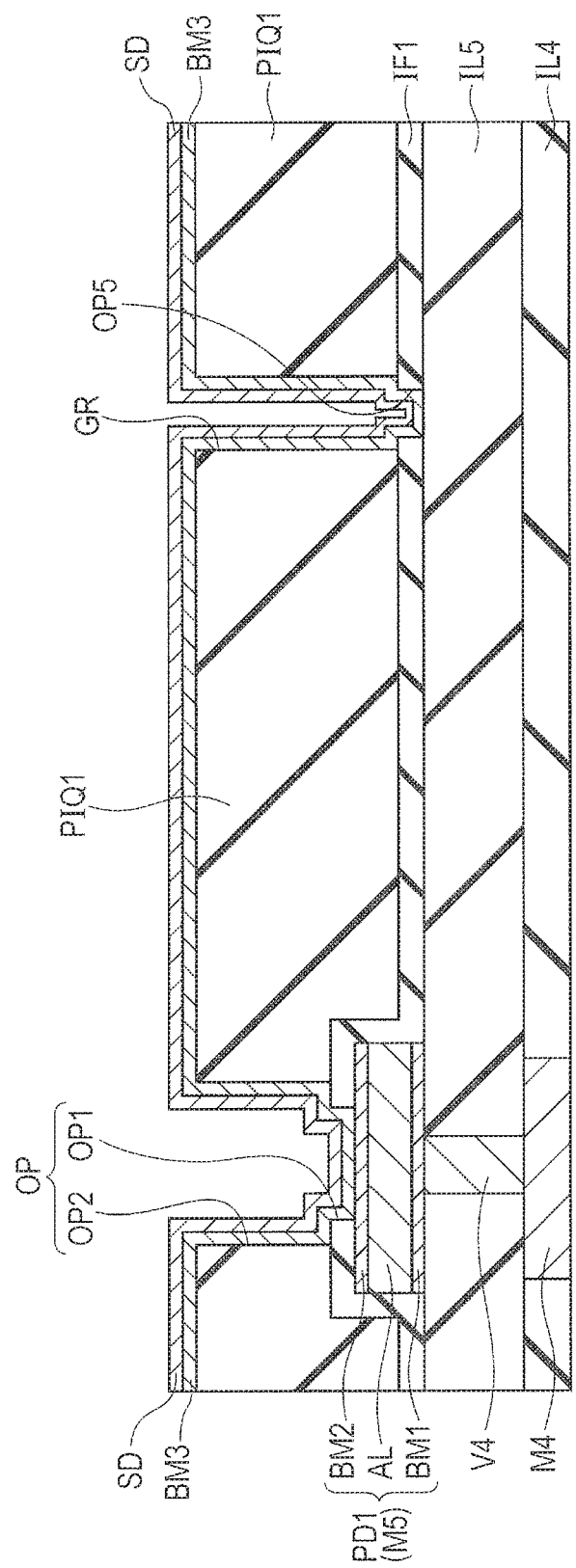
FIG. 17 shows a sectional view during a manufacturing process of the semiconductor device following that shown in FIG. 16.

FIG. 14 is a sectional view of a principal part of the semiconductor chip CHP and, like FIG. 2 of Embodiment 1, a sectional view taken along line A-A of FIG. 1. FIGS. 15 to 17 show sectional views during the manufacturing process of the semiconductor device of FIG. 14.

In Embodiment 3, as in Embodiment 1, the opening OP1 is formed in the insulating film IF1, and an opening OP5 is also formed in the insulating film IF1. Moreover, in Embodiment 3, as in Embodiment 2, the interlayer insulating film IL5 including a non-organic material is exposed at the bottom of the groove GR.

Hereafter, with reference to FIGS. 15 to 17, features of Embodiment 3 will be explained in detail.

FIG. 15 shows a manufacturing process corresponding to that shown in FIG. 4 of Embodiment 1. In Embodiment 3, formation processes of the interlayer insulating film IL5, the via V4, and the fifth wiring M5 are the same as those in Embodiment 1. In Embodiment 1, the insulating film IF1 is formed over the first pad electrode PD1 and the interlayer insulating film IL5, and the opening OP1 is formed in the insulating film IF1 after that. On the other hand, according to Embodiment 3, the insulating film IF1 is formed over the first pad electrode PD1 and the interlayer insulating film IL5, and openings OP1 and OP5 are formed in the insulating film IF1 after that. As in Embodiment 1, the opening OP1 of Embodiment 3 exposes part of the first pad electrode PD1. Moreover, at the bottom of the opening OP5, part of the interlayer insulating film IL5 is exposed.

FIG. 16 shows a manufacturing process corresponding to that shown in FIG. 5 of Embodiment 1, and shows formation processes of the organic insulating film PIQ1, the opening OP2, and the groove GR.

First, the organic insulating film PIQ1 is formed over the exposed first pad electrode PD, the exposed interlayer insulating film IL5, and the insulating film IF1. Next, the organic insulating film PIQ1 is patterned by being selectively exposed and developed. This forms, in the organic insulating film PIQ1, the opening OP2 which opens the opening OP1 so that the first pad electrode PD1 may be exposed and the groove GR which opens the opening OP5 so that the interlayer insulating film IL5 may be exposed.

FIG. 17 shows a manufacturing process corresponding to that shown in FIG. 6 of Embodiment 1, and shows formation processes of the barrier metal film BM3 and the seed layer SD.

First, the barrier metal film BM3 is formed, with use of the sputtering method, over the organic insulating film QIQ1, over the first pad electrode PD1 in the opening OP2, and over the interlayer insulating film IL5 in the groove GR. The formation process and material of the barrier metal film BM3 are the same as those of Embodiment 1. Next, over the barrier metal film BM3, using the sputtering method, the seed layer SD is formed. The formation process, film thickness, and material of the seed layer SD are the same as those of Embodiment 1.

After that, using the same technique as that of Embodiment 1, there are formed the re-wirings RW1 to RW5, the organic insulating film PIQ2, the opening OP3, and the terminal ET for external connection. In this manner, the semiconductor device shown in FIG. 14 is manufactured.

According to Embodiment 3, in the same process as the process to form the insulating film IF1 in the opening OP1, the opening OP5 is also formed in the insulating film IF1. Further, in the same process as the process to form the opening OP2 in the organic insulating film PIQ1, the groove GR is also formed in the organic insulating film PIQ1. Therefore, the number of manufacturing processes of Embodiment 3 is the same as the number of manufacturing processes of Embodiment 1.

Moreover, in Embodiment 3, as in Embodiment 2, since the interlayer insulating film IL5 including a non-organic material exists at the bottom of the groove GR, the reaction product RC is not formed over the interlayer insulating film IL5. Therefore, according to the semiconductor device of Embodiment 3, it becomes possible to suppress deterioration of the life of the HAST test and the increase in leakage current resulting from the reaction product RC between the re-wiring RW1 and the re-wiring RW2. As a result, the reliability of the semiconductor device can be improved.

Other features of Embodiment 3 are the same as those of Embodiment 1.

Although the invention made above by the present inventors has been described specifically on the basis of the preferred embodiments, the present invention is not limited to the embodiments referred to above. It is needless to say that various changes can be made thereto within the scope not departing from the gist thereof.

For example, the wirings M1 to M4 have been described referring to the damascene structure mainly containing copper. However, the same effect can be obtained also with the wiring structure which is formed by patterning the conductive film mainly containing aluminum.

What is claimed is:

1. A semiconductor device, comprising:
a semiconductor substrate;
a multilayer wiring layer formed over the semiconductor substrate and having a plurality of interlayer insulating films and a plurality of wiring layers;
a plurality of first pad electrodes formed over an uppermost interlayer insulating film among the interlayer insulating films and, at the same time, formed in an uppermost wiring layer among the wiring layers;
an insulating film formed over each of the first pad electrodes and over the interlayer insulating film in the uppermost layer and including a non-organic material;
a first organic insulating film formed over the insulating films;
a plurality of first openings provided in the first organic insulating film and in the insulating film and, at the same time, each of which reaching each of the first pad electrodes; and
a plurality of re-wirings formed over the first organic insulating film and inside each of the first openings, respectively,
wherein each of the re-wirings include a first barrier metal film and a first conductive film formed over the first barrier metal film,
wherein the re-wirings include:
a first re-wiring including a first portion extending in a first direction; and
a second re-wiring extending in the first direction in a plan view and, at the same time, including a second portion neighboring to the first portion in a second direction orthogonal to the first direction in a plan view;
wherein, in a plan view, in the first organic insulating film located between the first portion of the first re-wiring area and the second portion of the second re-wiring, there is formed a groove which extends along the first direction and, at the same time, penetrates the first organic insulating film and reaches the insulating film, and wherein, in the second direction, a width of the groove is smaller than a width of the first portion of the first re-wiring or a width of the second portion of the second re-wiring.

2. The semiconductor device according to claim 1, wherein the first re-wiring and the second re-wiring are coupled to electric potential being different from each other.

3. The semiconductor device according to claim 1,
wherein, further, a second organic insulating film is formed over each of the re-wirings and over the first organic insulating film, and
wherein the second organic insulating film is embedded inside the groove.

4. The semiconductor device according to claim 1,
wherein the re-wirings further include a third re-wiring being different from the first re-wiring and the second re-wiring,
wherein the third re-wiring includes a third portion extending in a first direction in a plan view and, at the same time, neighboring to the first portion of the first re-wiring in the second direction,
wherein, in the second direction, a distance between the third portion of the third re-wiring and the first portion of the first re-wiring is greater than a distance between the first portion of the first re-wiring and the third portion of the second re-wiring, and
wherein, in a plan view, a groove is not formed in the first organic insulating film between the third portion of the third re-wiring and the first portion of the first re-wiring.

5. The semiconductor device according to claim 1,
wherein, in the second direction, a distance between the first portion of the first re-wiring and the second portion of the second re-wiring is 12 μm or less.

6. The semiconductor device according to claim 1,
wherein the first organic insulating film includes polyimide,
wherein the first barrier metal film includes a material containing titanium, tantalum, or chromium, and
wherein the insulating film includes silicon nitride or oxy-silicon nitride.

7. A semiconductor device, comprising:
a semiconductor substrate;
a multilayer wiring layer formed over the semiconductor substrate and having a plurality of interlayer insulating films and a plurality of wiring layers;
a plurality of first pad electrodes formed over an uppermost interlayer insulating film among the interlayer insulating films and, at the same time, formed in an uppermost wiring layer among the wiring layers;
an insulating film formed over each of the first pad electrodes and over the interlayer insulating film in the uppermost layer and including a non-organic material;
a first organic insulating film formed over the insulating film;
a plurality of first openings provided in the first organic insulating film and in the insulating film and each of which reaching each of the first pad electrodes;
a plurality of re-wirings formed over the first organic insulating film and inside each of the first openings, respectively; and
a second organic insulating film formed over each of the re-wirings and over the first organic insulating film,
wherein each of the re-wirings includes a first barrier metal film and a first conductive film formed over the first barrier metal film,
wherein the re-wirings have a first wiring and a second wiring neighboring to each other,
wherein, in a plan view, in the first organic insulating film between the first re-wiring and the second re-wiring, a groove penetrating the first organic insulating film and reaching the insulating film is formed, and
wherein the second organic insulating film is embedded inside the groove.

8. The semiconductor device according to claim 7, wherein the first re-wiring and the second re-wiring are coupled to electric potential being different from each other.

9. The semiconductor device according to claim 7,
wherein the re-wirings further include a third re-wiring being different from the first re-wiring and the second re-wiring and, at the same time, neighboring to the first re-wiring,
wherein a distance between the third re-wiring and the first re-wiring is greater than a distance between the first re-wiring and the second re-wiring, and
wherein a groove is not formed in the first organic insulating film between the third re-wiring and the first re-wiring.

10. The semiconductor device according to claim 7, wherein a distance between the first re-wiring and the second re-wiring is 12 μm or less.

11. The semiconductor device according to claim 7,
wherein the first organic insulating film and the second organic insulating film include polyimide, respectively,
wherein the first barrier metal film is formed from a material containing, titanium, tantalum, or chromium, and
wherein the insulating film includes silicon nitride or oxy-silicon nitride.

* * * * *